US012489415B2

(12) United States Patent
Koulakis et al.

(10) Patent No.: US 12,489,415 B2
(45) Date of Patent: Dec. 2, 2025

(54) ACOUSTIC RESONATOR LID FOR THERMAL TRANSPORT

(71) Applicant: Murata Manufacturing Co., Ltd., Nagaokakyo (JP)

(72) Inventors: John Koulakis, Los Angeles, CA (US); Greg Dyer, Santa Barbara, CA (US); Sean McHugh, Santa Barbara, CA (US); Patrick Turner, Portola Valley, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 231 days.

(21) Appl. No.: 18/488,277

(22) Filed: Oct. 17, 2023

(65) Prior Publication Data
US 2024/0137004 A1  Apr. 25, 2024
US 2024/0235525 A9  Jul. 11, 2024

Related U.S. Application Data

(60) Provisional application No. 63/417,523, filed on Oct. 19, 2022.

(51) Int. Cl.
H03H 9/02 (2006.01)
H03H 9/17 (2006.01)
H03H 9/56 (2006.01)

(52) U.S. Cl.
CPC .... *H03H 9/02228* (2013.01); *H03H 9/02102* (2013.01); *H03H 9/174* (2013.01); *H03H 9/568* (2013.01)

(58) Field of Classification Search
CPC .... H03H 9/174; H03H 9/02228; H03H 9/568; H03H 9/02102
(Continued)

(56) References Cited

U.S. PATENT DOCUMENTS 5,705,399 A   1/1998  Larue
5,853,601 A  12/1998  Krishaswamy et al.
(Continued)

FOREIGN PATENT DOCUMENTS

CN  201893487 A   7/2011
JP  10-209804 A   8/1998
(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Jorge L Salazar, Jr.
(74) *Attorney, Agent, or Firm* — ArentFox Schiff LLP

(57) ABSTRACT

An apparatus for filtering radio frequency signals is provided. The apparatus includes a substrate and a membrane coupled to the substrate that includes piezoelectric material. The apparatus also includes an interdigital transducer (IDT) coupled to the membrane and includes a plurality of interleaved fingers. The apparatus also includes a lid, in which the membrane is arranged between the substrate and the lid with a first cavity having a first height between the lid and a first main surface of the membrane and a second cavity having a second height between the substrate and a second main surface of the membrane that opposes the first main surface. Moreover, the first height between the lid and the first main surface of the membrane is greater than a pitch of at least one pair of interleaved fingers of the plurality of interleaved fingers and at most four times greater than the second height.

20 Claims, 11 Drawing Sheets

(58) Field of Classification Search
USPC .................................................. 333/193–196
See application file for complete search history.

(56) References Cited

U.S. PATENT DOCUMENTS

| | | |
|---|---|---|
| 6,540,827 B1 | 4/2003 | Levy et al. |
| 6,707,229 B1 | 3/2004 | Martin |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,802,466 B2 | 9/2010 | Whalen et al. |
| 7,868,519 B2 | 1/2011 | Umeda |
| 8,278,802 B1 | 10/2012 | Lee et al. |
| 8,344,815 B2 | 1/2013 | Yamanaka |
| 8,829,766 B2 | 9/2014 | Milyutin et al. |
| 8,932,686 B2 | 1/2015 | Hayakawa et al. |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,748,923 B2 | 8/2017 | Kando et al. |
| 9,780,759 B2 | 10/2017 | Kimura et al. |
| 10,200,013 B2 | 2/2019 | Bower et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 2002/0079986 A1 | 6/2002 | Ruby et al. |
| 2002/0158714 A1 | 10/2002 | Kaitila et al. |
| 2003/0199105 A1 | 10/2003 | Kub et al. |
| 2004/0090145 A1 | 5/2004 | Bauer et al. |
| 2004/0261250 A1 | 12/2004 | Kadota et al. |
| 2006/0125489 A1 | 6/2006 | Feucht et al. |
| 2006/0222568 A1 | 10/2006 | Wang et al. |
| 2007/0170565 A1 | 7/2007 | Hong et al. |
| 2007/0194863 A1 | 8/2007 | Shibata et al. |
| 2010/0064492 A1 | 3/2010 | Tanaka |
| 2010/0123367 A1 | 5/2010 | Tai et al. |
| 2010/0212127 A1 | 8/2010 | Heinze et al. |
| 2010/0301703 A1 | 12/2010 | Chen et al. |
| 2011/0109196 A1 | 5/2011 | Goto |
| 2011/0278993 A1 | 11/2011 | Iwamoto |
| 2013/0015353 A1 | 1/2013 | Tai et al. |
| 2013/0321100 A1 | 12/2013 | Wang |
| 2014/0001919 A1 | 1/2014 | Komatsu |
| 2014/0113571 A1 | 4/2014 | Fujiwara |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0218129 A1 | 8/2014 | Fujiwara |
| 2014/0225684 A1 | 8/2014 | Kando et al. |
| 2015/0319537 A1 | 11/2015 | Perois et al. |
| 2015/0333730 A1 | 11/2015 | Meltaus |
| 2016/0028367 A1 | 1/2016 | Shealy |
| 2016/0182009 A1 | 6/2016 | Bhattacharjee |
| 2017/0063332 A1 | 3/2017 | Gilbert et al. |
| 2017/0170808 A1 | 6/2017 | Iwaki et al. |
| 2017/0179928 A1 | 6/2017 | Raihn et al. |
| 2017/0214387 A1 | 7/2017 | Burak et al. |
| 2017/0222622 A1 | 8/2017 | Solal et al. |
| 2017/0324394 A1 | 11/2017 | Ebner et al. |
| 2017/0370791 A1 | 12/2017 | Nakamura et al. |
| 2018/0123016 A1 | 5/2018 | Gong et al. |
| 2018/0152169 A1 | 5/2018 | Goto et al. |
| 2018/0191322 A1 | 7/2018 | Chang et al. |
| 2019/0068164 A1 | 2/2019 | Houlden et al. |
| 2019/0131953 A1 | 5/2019 | Gong |
| 2019/0181833 A1 | 6/2019 | Nosaka |
| 2019/0273480 A1 | 9/2019 | Lin |
| 2019/0273481 A1 | 9/2019 | Michigami |
| 2020/0304091 A1 | 9/2020 | Yantchev |
| 2020/0336130 A1 | 10/2020 | Turner |
| 2020/0373907 A1 | 11/2020 | Garcia |
| 2021/0006228 A1 | 1/2021 | Garcia |
| 2021/0013859 A1 | 1/2021 | Turner et al. |
| 2021/0013868 A1 | 1/2021 | Plesski |
| 2021/0126619 A1 | 4/2021 | Wang et al. |
| 2021/0273631 A1 | 9/2021 | Jachowski et al. |
| 2022/0103160 A1 | 3/2022 | Jachowski |
| 2022/0231661 A1 | 7/2022 | McHugh |
| 2024/0030893 A1* | 1/2024 | Nakao ................ H03H 9/02062 |

FOREIGN PATENT DOCUMENTS

| | | |
|---|---|---|
| JP | 2002300003 A | 10/2002 |
| JP | 2007251910 A | 9/2007 |
| JP | 2010103803 A | 5/2010 |
| JP | 2015054986 A | 3/2015 |
| JP | 2016001923 A | 7/2016 |
| JP | 2017220910 A | 12/2017 |
| JP | 2018166259 A | 10/2018 |
| JP | 2018207144 A | 12/2018 |
| JP | 2019186655 A | 10/2019 |
| JP | 2020088459 A | 6/2020 |
| JP | 2020113939 A | 7/2020 |
| WO | 2015098694 A1 | 7/2015 |
| WO | 2016017104 A1 | 2/2016 |
| WO | 2016052129 A1 | 4/2016 |
| WO | 2018003273 A1 | 1/2018 |
| WO | 2018079522 A1 | 5/2018 |
| WO | 2018163860 A1 | 9/2018 |
| WO | 2019138810 A1 | 7/2019 |
| WO | 2019241174 A1 | 12/2019 |
| WO | 2020092414 A2 | 5/2020 |
| WO | 2020175234 A1 | 9/2020 |
| WO | 2021060523 A1 | 4/2021 |
| WO | 2023002858 A1 | 1/2023 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. 1, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary "Meaning of diaphragm" Merriam Webster since 1828.

(56) References Cited

OTHER PUBLICATIONS

Safari et al. "Piezoelectric for Transducer Applications" published by Elsevier Science Ltd., pp. 4 (Year: 2000).
Moussa et al. Review on Triggered Liposomal Drug Delivery with a Focus on Ultrasound 2015, Bentham Science Publishers, pp. 16 (Year 2005).
"Acoustic Properties of Solids" ONDA Corporation, 592 Weddell Drive, Sunnyvale, CA 94089, Apr. 11, 2003, pp. 5 (Year 2003).
Bahreynl, B., "Fabrication and Design of Resonant Microdevices" Andrew William, Inc. 2018, NY (Year 2008).
Material Properties of Tibtech Innovations, © 2018 TIBTECH Innovations (Year 2018).
Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.
Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).
Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.
Wei Pang et al. "Analytical and experimental study on the second harmonic mode response of a bulk acoustic wave resonator" 2010 J. Micromech. Microeng. 20 115015; doi:10.1088/0960-1317/20/11/115015.
Durmus et al. "Acoustic-Based Biosensors" Encyclopedia of Microfluidics and Nanofluidics. DOI 10.1007/978-3-642-27758-0_10-2 Springer Science+Business Media New York 2014.
USPTO/ISA, International Search Report and Written Opinion for PCT Application No. PCT/US2023/017732 dated Jul. 27, 2023.
USPTO/ISA, International Search Report and Written Opinion for PCT Application No. PCT/US2022/082421 dated May 3, 2023.
USPTO/ISA, International Search Report and Written Opinion for PCT Application No. PCT/US2022/081095 dated May 30, 2023.
USPTO/ISA, International Search Report and Written Opinion for PCT Application No. PCT/US2022/079236 dated Mar. 10, 2023.
USPTO/ISA, International Search Report and Written Opinion for PCT Application No. PCT/US2022/081068 dated Apr. 18, 2023.
USPTO/ISA, International Search Report and Written Opinion for PCT Application No. PCT/US2022/080246 dated Mar. 30, 2023.

* cited by examiner

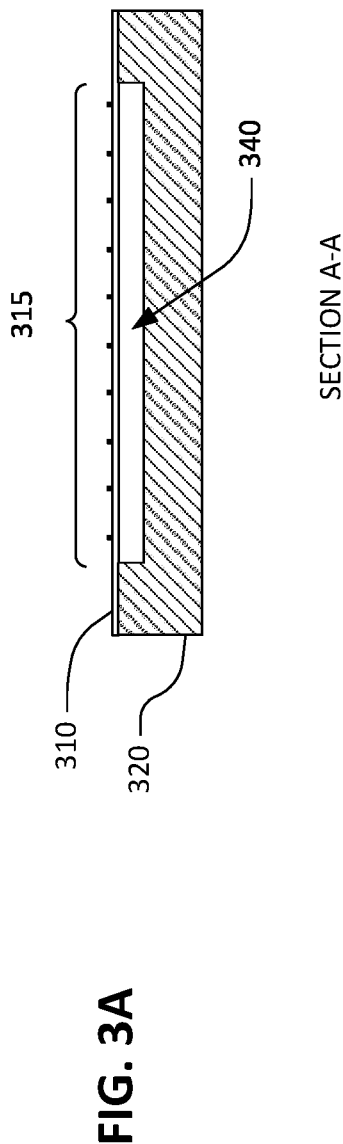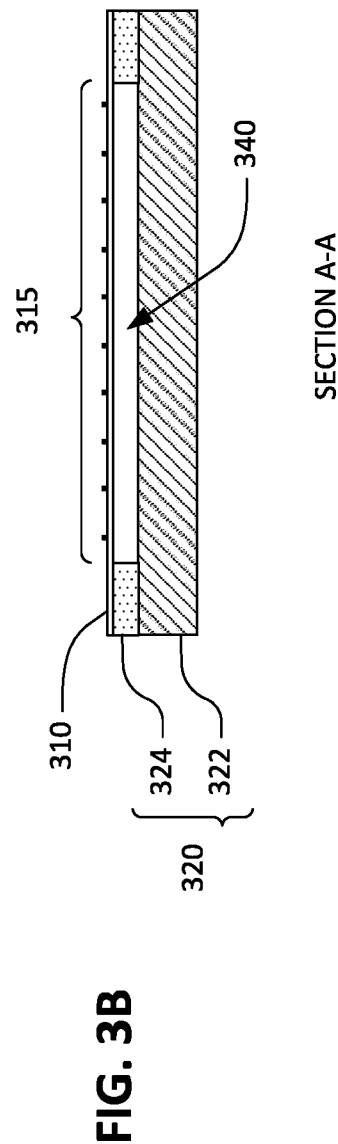

ACOUSTIC RESONATOR LID FOR THERMAL TRANSPORT

CROSS REFERENCE TO RELATED APPLICATIONS

This application claims priority to U.S. Patent Provisional Application No. 63/417,523, filed Oct. 19, 2023, the entire contents of which are hereby incorporated by reference.

TECHNICAL FIELD

This disclosure relates to radio frequency filters using acoustic wave resonators, and, more specifically, to a resonator with a lid for improved thermal transport.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "passband" of the filter. The range of frequencies stopped by such a filter is referred to as the "stopband" of the filter. A typical RF filter has at least one passband and at least one stop-band. Specific requirements on a passband or stop-band may depend on the specific application. For example, in some cases a "passband" may be defined as a frequency range where the insertion loss of a filter is better than a defined value such as 1 dB, 2 dB, or 3 dB, while a "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

Performance enhancements to the RF filters in a wireless system can have a broad impact on system performance, especially for the acoustic resonators of an RF filter operating at higher modes. Improvements in RF filters can be leveraged to provide system performance improvements, such as larger cell size, longer battery life, higher data rates, greater network capacity, lower cost, enhanced security, higher reliability, etc. These improvements can be realized at many levels of the wireless system both separately and in combination, for example, at the RF module, RF transceiver, mobile or fixed sub-system, or network levels.

However, even with the continuing developments in this technology, XBAR resonators suffer from high temperatures when driven at high power during operation. For example, XBAR resonators based on free-standing membranes often have a large thermal impedance for heat dissipated during high power operation. This effect can limit operating power and product lifetime.

SUMMARY

Thus, according to exemplary aspect of the present disclosure, an acoustic resonator is disclosed having a lid configuration for improved thermal transport. In particular, the acoustic resonator can include a piezoelectric layer; an interdigital transducer (IDT) at a surface of the piezoelectric layer and comprising a plurality of interleaved fingers; a lid disposed above the piezoelectric layer and defining a first cavity between the lid and the piezoelectric layer; a substrate disposed below the piezoelectric layer opposite the lid; and a dielectric layer disposed between the substrate and the piezoelectric layer and having a second cavity extending at least partially therein. In this aspect, the height of the first cavity is greater than a pitch of at least two interleaved fingers of the plurality of interleaved fingers and at most four times greater than a height of the second cavity.

In another exemplary aspect, the height of the first cavity is greater than or equal to the height of the second cavity.

In another exemplary aspect, the pitch corresponds to a center-to-center spacing between the at least two interleaved fingers.

In another exemplary aspect, a thermal conduction between the piezoelectric layer and the lid corresponds to a thermal conduction through the first cavity based on a distance between the lid and the piezoelectric layer being configured to correspond to the height of the first cavity.

In another exemplary aspect, a thermal conduction between the piezoelectric layer and the lid forms a thermal conduction channel that is proportional to an area of the first cavity and the height of the first cavity.

In yet another exemplary aspect, the lid comprises a semiconductor material.

In another exemplary aspect, the piezoelectric layer and the IDT is configured such that a respective radio frequency signal applied to the IDT primarily excites a shear acoustic mode within the piezoelectric layer.

In another exemplary aspect, the acoustic resonator further includes a gas filled in the first cavity and the second cavity that is configured to increase thermal conduction through the first cavity and the second cavity.

In another exemplary aspect, the height of each of the first cavity and the second cavity is measured in a direction substantially and/or predominantly perpendicular to a surface of the piezoelectric layer.

In another exemplary aspect, the acoustic resonator further includes a metal layer disposed between the lid and the piezoelectric layer, such that an inner surface of the metal layer defines the first cavity between the lid and the piezoelectric layer. Moreover, the acoustic resonator can include an additional dielectric layer on the IDT and between the interleaved fingers of the IDT, such that the height of the first cavity is defined between a bottom surface of the lid and a surface of the dielectric layer that is opposite the IDT.

According to an exemplary aspect, a filter device is provided that includes at least one piezoelectric layer; a plurality of interdigital transducers (IDTs) at a surface of the at least one piezoelectric layer and each comprising a plurality of interleaved fingers; a plurality of lids disposed above the at least one piezoelectric layer, respectively, and defining a plurality of first cavities between the respective plurality of lids and the at least one piezoelectric layer, at least one substrate disposed below the at least one piezoelectric layer, respectively, and opposite the plurality of lids; and at least one dielectric layer disposed between the at least one substrate and the at least one piezoelectric layer and having a plurality of second cavities extending at least partially therein. In this aspect, a height of each of the plurality of first cavities is greater than a pitch of at least two interleaved fingers of the plurality of interleaved fingers and at most four times greater than a height of each of the plurality of second cavities.

According to an exemplary aspect, a radio frequency module is provided that includes a filter device having a plurality of acoustic resonators that each comprise a piezoelectric layer; an interdigital transducer (IDT) at a surface of the piezoelectric layer and comprising a plurality of interleaved fingers; a lid disposed above the piezoelectric layer and defining a first cavity between the lid and the piezoelectric layer; a substrate disposed below the piezoelectric layer opposite the lid; and a dielectric layer disposed between the substrate and the piezoelectric layer and having a second cavity extending at least partially therein. In this aspect, a radio frequency circuit coupled to the filter device, the filter device and the radio frequency circuit being enclosed within a common package. Moreover, for each of the plurality of acoustic resonators, a height of the first cavity is greater than a pitch of at least one pair of interleaved fingers of the plurality of interleaved fingers and at most four times greater than a height of the second cavity.

The above simplified summary of example aspects serves to provide a basic understanding of the present disclosure. This summary is not an extensive overview of all contemplated aspects and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and exemplary pointed out in the claims.

BRIEF DESCRIPTION OF THE DRAWINGS

The accompanying drawings, which are incorporated into and form a part of this specification, illustrate one or more example aspects of the present disclosure and, together with the detailed description, serve to explain their principles and implementations.

FIG. 3A is a schematic cross-sectional view of an XBAR according to an exemplary aspect.

FIG. 3B is an alternative schematic cross-sectional view of an XBAR according to an exemplary aspect.

DETAILED DESCRIPTION

Figure 1A:
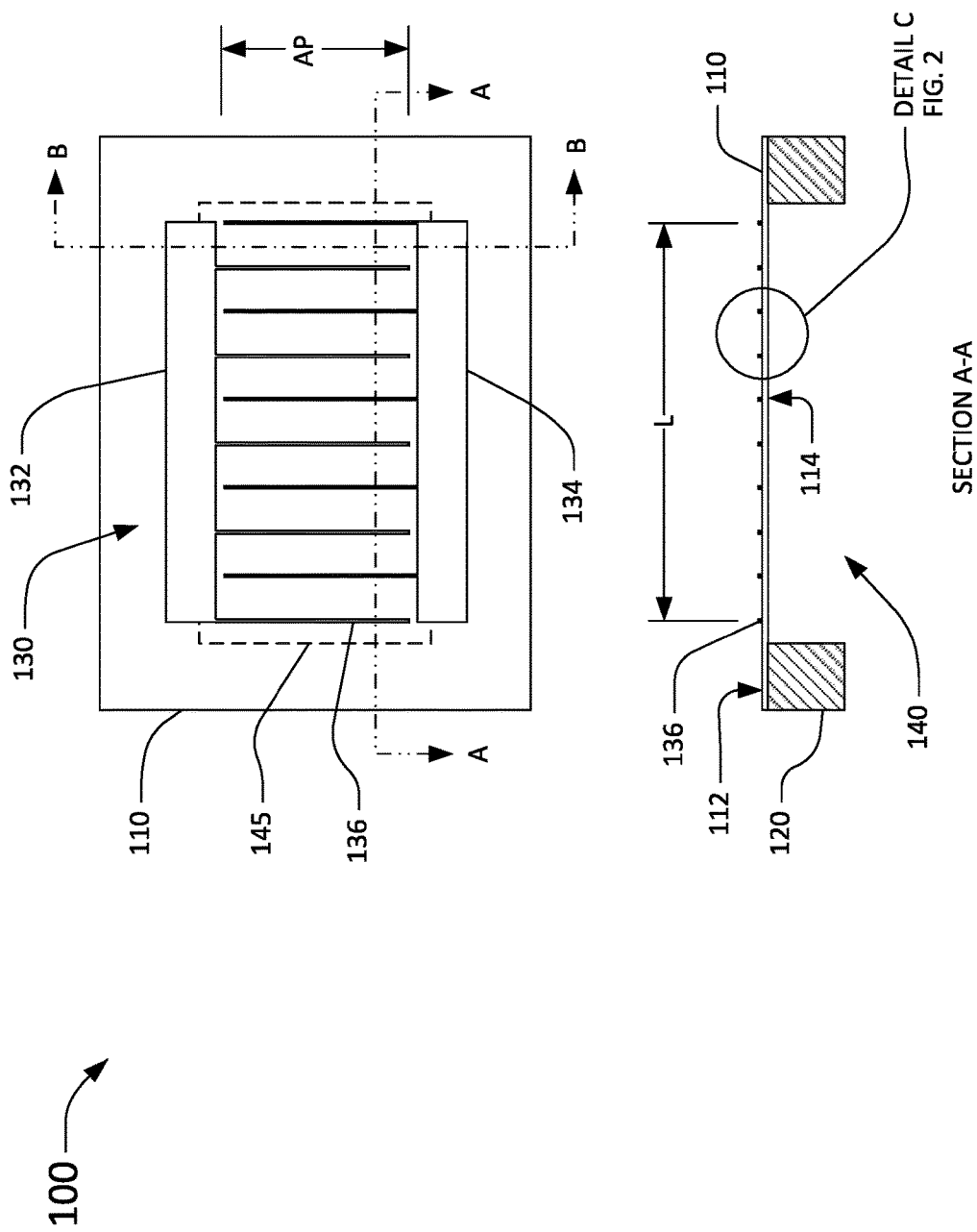
FIG. 1A includes a schematic plan view and two schematic cross-sectional views of a transversely excited film bulk acoustic resonator (XBAR).

Various aspects of the disclosed acoustic resonator, filter device and method of manufacturing the same are now described with reference to the drawings, wherein like reference numerals are used to refer to like elements throughout. In the following description, for purposes of explanation, numerous specific details are set forth in order to promote a thorough understanding of one or more aspects of the disclosure. It may be evident in some or all instances, however, that any aspects described below can be practiced without adopting the specific design details described below. In other instances, well-known structures and devices are shown in block diagram form in order to facilitate description of one or more aspects. The following presents a simplified summary of one or more aspects of the invention in order to provide a basic understanding thereof.

FIG. 1A shows a simplified schematic top view and orthogonal cross-sectional views of an acoustic resonator device, namely a transversely excited film bulk acoustic resonator (XBAR) 100. XBAR resonators, such as the resonator 100, may be used in a variety of RF filters including band-reject filters, band-pass filters, duplexers, and multiplexers. XBARs are particularly suited for use in filters for communications bands with frequencies above 3 GHz.

In general, the XBAR 100 is made up of a thin film conductor pattern formed at one or both surfaces of a piezoelectric layer 110 (herein piezoelectric plate or piezoelectric layer may be used interchangeably) having parallel front side 112 and a back side 114, respectively (also referred to generally first and second surfaces, respectively). It should be appreciated that the term "parallel" generally refers to the front side 112 and back side 114 being opposing to each other and that the surfaces are not necessarily planar and parallel to each other. For example, to the manufacturing variances result from the deposition process, the front side 112 and back side 114 may have undulations of the surface as would be appreciated to one skilled in the art.

According to an exemplary aspect, the piezoelectric layer is a thin single-crystal layer of a piezoelectric material, such as lithium niobate, lithium tantalate, lanthanum gallium silicate, gallium nitride, or aluminum nitride. It should be appreciated that the term "single-crystal" does not necessarily mean entirely of a uniform crystalline structure and may include impurities due to manufacturing variances as long as the crystal structure is within acceptable tolerances. The piezoelectric layer is cut such that the orientation of the X, Y, and Z crystalline axes with respect to the front and back sides is known and consistent. In the examples described herein, the piezoelectric layers are Z-cut, which is to say the Z axis is normal to the front and back sides 112, 114. However, XBARs may be fabricated on piezoelectric layers with other crystallographic orientations including rotated Z-cut, Z-cut and rotated YX cut.

The Y-cut family, such as 120Y and 128Y, are typically referred to as 120YX or 128YX, where the "cut angle" is the angle between the y axis and the normal to the layer. The "cut angle" is equal to β+90°. For example, a layer with Euler angles [0°, 30°, 0°] is commonly referred to as "120° rotated Y-cut" or "120Y." Thus, the Euler angles for 120YX and 128YX are (0, 120-90, 0) and (0, 128-90, 0) respectively. A "Z-cut" is typically referred to as a ZY cut and is understood to mean that the layer surface is normal to the Z axis but the wave travels along the Y axis. The Euler angles for ZY cut are (0, 0, 90).

The back side 114 of the piezoelectric layer 110 may be at least partially supported by a surface of the substrate 120 except for a portion of the piezoelectric layer 110 that forms a diaphragm 115 that is over (e.g., spanning or extending over) a cavity 140 in one or more layers below the piezoelectric layer 110 such as one or more intermediate layers above or in the substrate. In other words, the back side 114 of the piezoelectric layer 110 can be coupled or connected either directly or indirectly, via one or more intermediate layers (e.g., a dielectric layer), to a surface of the substrate 120. Moreover, the phrase "supported by" or "attached" may, as used herein interchangeably, mean attached directly, attached indirectly, mechanically supported, structurally supported, or any combination thereof. The portion of the piezoelectric layer that is over (e.g., spanning or extending over) the cavity can be referred to herein as a "diaphragm" 115 due to its physical resemblance to the diaphragm of a microphone. As shown in FIG. 1, the diaphragm 115 is contiguous with the rest of the piezoelectric layer 110 around all of a perimeter 145 of the cavity 140. In this context, "contiguous" means "continuously connected without any intervening item". However, the diaphragm 115 can be configured with at least 50% of the edge surface of the diaphragm 115 coupled to the edge of the piezoelectric layer 110 in an exemplary aspect.

According to the exemplary aspect, the substrate 120 is configured to provide mechanical support to the piezoelectric layer 110. The substrate 120 may be, for example, silicon, sapphire, quartz, or some other material or combination of materials. The back side 114 of the piezoelectric layer 110 may be bonded to the substrate 120 using a wafer bonding process. Alternatively, the piezoelectric layer 110 may be grown on the substrate 120 or supported by, or attached to, the substrate in some other manner.

Figure 1B:
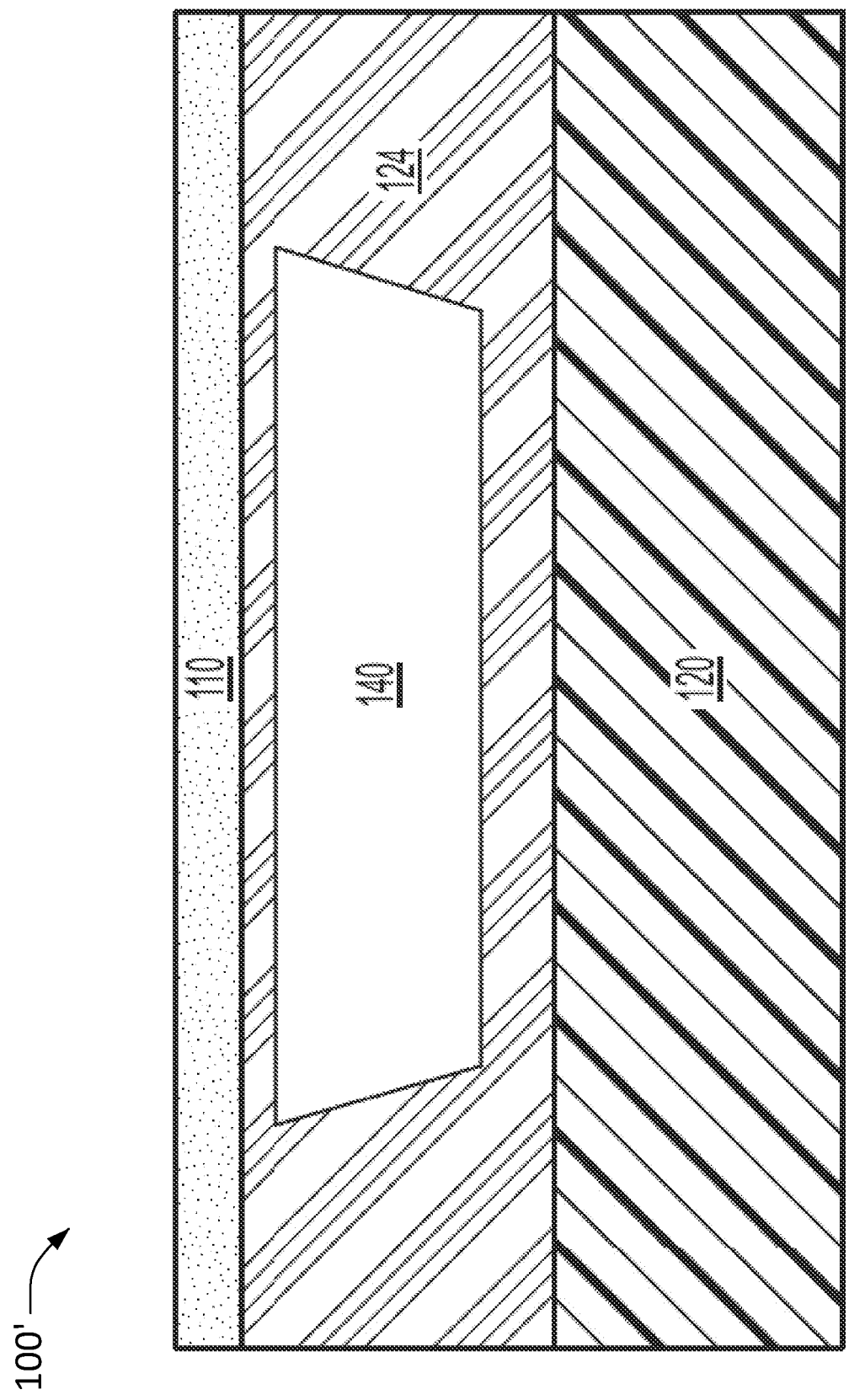
FIG. 1B shows a schematic cross-sectional view of an alternative configuration of an XBAR.

For purposes of this disclosure, "cavity" has its conventional meaning of "an empty space within a solid body." The cavity 140 may be a hole completely through the substrate 120 (as shown in Section A-A), a hole within a dielectric layer (as shown in FIG. 1B), or a recess in the substrate 120. The cavity 140 may be formed, for example, by selective etching of the substrate 120 before or after the piezoelectric layer 110 and the substrate 120 are attached, either directly or indirectly.

As shown, the conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved with each other. At least a portion of the interleaved fingers overlap for a distance AP, commonly referred to as the "aperture" of the IDT. The center-to-center distance L between the outermost fingers of the IDT 130 is the "length" of the IDT.

In the example of FIG. 1A, the IDT 130 is at the surface of the front side 112 (e.g., the first surface) of the piezoelectric layer 110. However, as discussed below, in other configurations, the IDT 130 may be at the surface of the back side 114 (e.g., the second surface) of the piezoelectric layer 110 or at both the surfaces of the front and back sides 112, 114 of the piezoelectric layer 110, respectively.

The first and second busbars 132, 134 are configured as the terminals of the XBAR 100. In operation, a radio frequency or microwave signal applied between the two busbars 132, 134 of the IDT 130 primarily excites an acoustic mode within the piezoelectric layer 110. As will be discussed in further detail, the primarily excited acoustic mode is a bulk shear mode or bulk acoustic wave where acoustic energy of a bulk shear acoustic wave is excited in the piezoelectric layer 110 by the IDT 130 and propagates along a direction substantially and/or primarily orthogonal to the surface of the piezoelectric layer 110, which is also primarily normal, or transverse, to the direction of the electric field created by the IDT fingers. That is, when a radio frequency or a microwave signal is applied between the two busbars 132, 134, the RF voltage applied to the respective sets of IDT fingers generates a time-varying electric field that is laterally excited with respect to a surface of the piezoelectric layer 110. Thus, in some cases the primarily excited acoustic mode may be commonly referred to as a laterally excited bulk acoustic wave since displacement, as opposed to propagation, occurs primarily in the direction of the bulk of the piezoelectric layer, as discussed in more detail below in reference to FIG. 4

For purposes of this disclosure, "primarily acoustic mode" may generally refer to an operational mode in which a vibration displacement is caused in the primarily thickness-shear direction (e.g., X-direction), so the wave propagates substantially and/or primarily in the direction connecting the opposing front and back surfaces of the piezoelectric layer, that is, in the Z direction. In other words, the X-direction component of the wave is significantly smaller than the Z-direction component. The use of the term "primarily" in the "primarily excited acoustic mode" is not necessarily referring to a lower or higher order mode. Thus, the XBAR is considered a transversely excited film bulk wave resonator. One physical constraint is that when the radio frequency or microwave signal is applied between the two busbars 132, 134 of the IDT 130, heat is generated that must be dissipated from the resonator for improved performance. In general, heat can be dissipated by lateral conduction on the membrane (e.g., in the electrodes themselves), and vertical conduction through a cavity to substrate. The exemplary aspects described below provide for improved thermal transport to improve performance (e.g., Q-factor) of the resonator.

In an event, the IDT 130 is positioned at or on the piezoelectric layer 110 such that at least the fingers of the IDT extend at or on the portion of the piezoelectric layer 110 that is over the cavity 140, for example, the diaphragm 115 as described herein. As shown in FIG. 1, the cavity 140 has a rectangular cross section with an extent greater than the aperture AP and length L of the IDT 130. According to other exemplary aspects, the cavity of an XBAR may have a different cross-sectional shape, such as a regular or irregular polygon. The cavity of an XBAR may have more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT. For example, an XBAR may have hundreds, possibly thousands, of parallel fingers in the IDT according to exemplary aspects. Similarly, the thickness of the fingers in the cross-sectional views is greatly exaggerated.

FIG. 1B shows a schematic cross-sectional view of an alternative XBAR configuration 100'. In FIG. 1B, the cavity 140 (which can correspond generally to cavity 140 of FIG. 1A) of the resonator 100' is formed entirely within a dielectric layer 124 (for example SiO$_2$, as in FIG. 1B) that is located between the substrate 120 (indicated as Si in FIG.

1B) and the piezoelectric layer 110 (indicated as LN in FIG. 1B). Although a single dielectric layer 124 is shown having cavity 140 formed therein (e.g., by etching), it should be appreciated that the dielectric layer 124 can be formed by a plurality of separate dielectric layers formed on each other.

Moreover, in the example of FIG. 1B, the cavity 140 is defined on all sides by the dielectric layer 124. However, in other exemplary embodiments, one or more sides of the cavity 140 may be defined by the substrate 120 or the piezoelectric layer 110. In the example of FIG. 1B, the cavity 140 has a trapezoidal shape. However, as noted above, cavity shape is not limited and may be rectangular, oval, or other shapes.

Figure 2A:
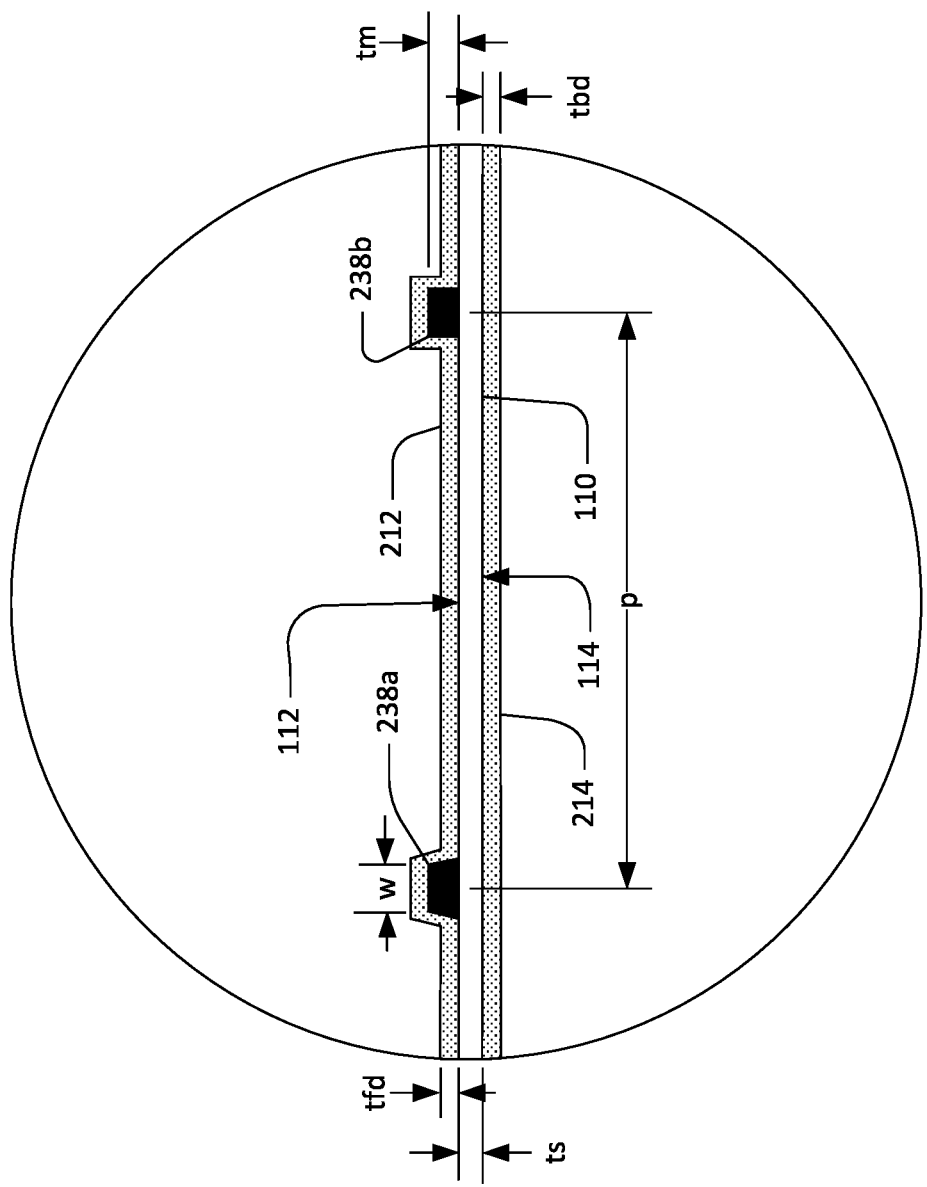
FIG. 2A is an expanded schematic cross-sectional view of a portion of the XBAR of FIG. 1A.

FIG. 2A shows a detailed schematic cross-sectional view of the XBAR 100 of FIG. 1A or 1B. The piezoelectric layer 110 is a single-crystal layer of piezoelectrical material having a thickness ts. ts may be, for example, 100 nm to 1500 nm. When used in filters for 5G NR and Wi-Fi™ bands from 3.4 GHZ to 7 GHz, the thickness ts may be, for example, 150 nm to 500 nm.

In this aspect, a front side dielectric layer 212 (e.g., a first dielectric coating layer or material) can be formed on the front side 112 of the piezoelectric layer 110. The "front side" of the XBAR is, by definition, the surface facing away from the substrate. The front side dielectric layer 212 has a thickness tfd. As shown in FIG. 2A the front side dielectric layer 212 covers the IDT fingers 238a, 238b, which can correspond to fingers 136 as described above with respect to FIG. 1A. Although not shown in FIG. 2A, the front side dielectric layer 212 may also be deposited only between the IDT fingers 238a, 238b. In this case, an additional thin dielectric layer (not shown) may be deposited over the IDT fingers to seal and passivate the fingers. Further, although also not shown in FIG. 2A, the front side dielectric layer 212 may also be deposited only on select IDT fingers 238a, for example.

A back side dielectric layer 214 (e.g., a second dielectric coating layer or material) can also be formed on the back side of the back side 114 of the piezoelectric layer 110. In general, for purposes of this disclosure, the term "back side" means on a side opposite the conductor pattern of the IDT structure and/or opposite the front side dielectric layer 212. Moreover, the back side dielectric layer 214 has a thickness tbd. The front side and back side dielectric layers 212, 214 may be a non-piezoelectric dielectric material, such as silicon dioxide or silicon nitride. Tfd and tbd may be, for example, 0 to 500 nm. Tfd and tbd may be less than the thickness ts of the piezoelectric layer. Tfd and tbd are not necessarily equal, and the front side and back side dielectric layers 212, 214 are not necessarily the same material. Either or both of the front side and back side dielectric layers 212, 214 may be formed of multiple layers of two or more materials according to various exemplary aspects.

The IDT fingers 238a, 238b may be aluminum, substantially aluminum alloys, copper, substantially copper alloys, beryllium, gold, or some other conductive material. Thin (relative to the total thickness of the conductors) layers of other metals, such as chromium or titanium, may be formed under and/or over the fingers to improve adhesion between the fingers and the piezoelectric layer 110 and/or to passivate or encapsulate the fingers. The busbars (132, 134 in FIG. 1) of the IDT may be made of the same or different materials as the fingers. The cross-sectional shape of the IDT fingers may be trapezoidal (finger 238a), rectangular (finger 238b) or some other shape in various exemplary aspects.

Figure 2C:
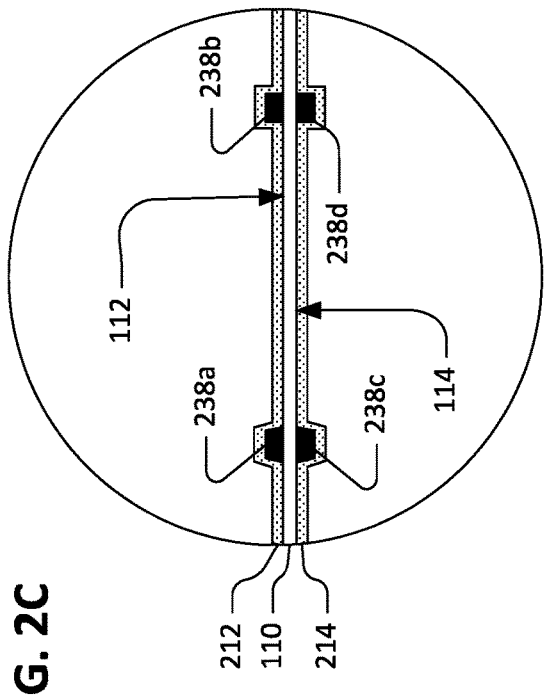
FIG. 2C is an expanded schematic cross-sectional view of another alternative configuration of the XBAR of FIG. 1A.
Figure 2B:
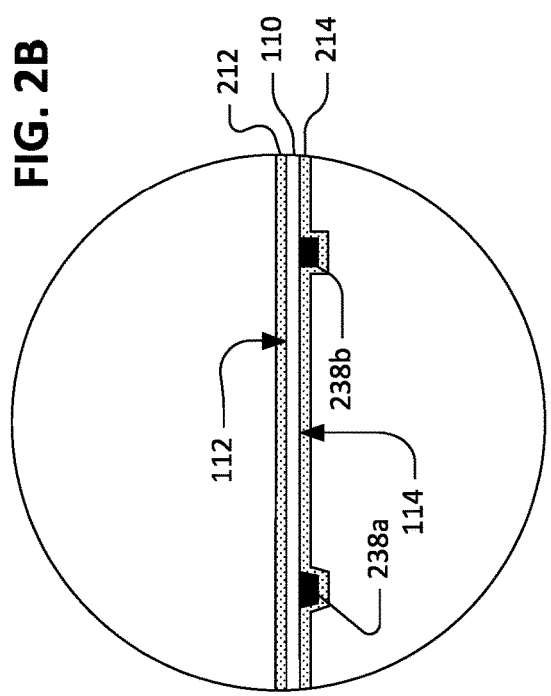
FIG. 2B is an expanded schematic cross-sectional view of an alternative configuration of the XBAR of FIG. 1A.

Dimension p is the center-to-center spacing between adjacent IDT fingers, such as the IDT fingers 238a, 238b in FIGS. 2A-2C. Center points of center-to-center spacing may be measured at a center of the width "w" of a finger as shown in FIG. 2A. In some cases, the center-to-center spacing may change if the width of a given finger changes along the length of the finger, if the width and extending direction changes, or any variation thereof. In that case, for a given location along AP, center-to-center spacing may be measured as an average center-to-center spacing, a maximum center-to-center spacing, a minimum center-to-center spacing, or any variation thereof. Adjacent fingers may each extend from a different busbar and center-to-center spacing may be measured from a center of a first finger extending from a first busbar to a center of a second finger, adjacent to the first finger, extending from a second busbar. The center-to-center spacing may be constant over the length of the IDT, in which case the dimension p may be referred to as the pitch of the IDT and/or the pitch of the XBAR. However, according to an exemplary aspect as will be discussed in more detail below, the center-to-center spacing varies along the length of the IDT, in which case the pitch of the IDT may be the average value of dimension p over the length of the IDT. Center-to-center spacing from one finger to an adjacent finger may vary continuously when compared to other adjacent fingers, in discrete sections of multiple adjacent pairs, or any combination thereof. Each IDT finger, such as the IDT fingers 238a, 238b in FIGS. 2A, 2B, and 2C, has a width w measured normal to the long direction of each finger. The width w may also be referred to herein as the "mark." In general, the width of the IDT fingers may be constant over the length of the IDT, in which case the dimension w may be the width of each IDT finger. However, in an exemplary aspect as will be discussed below, the width of individual IDT fingers varies along the length of the IDT 130, in which case dimension w may be the average value of the widths of the IDT fingers over the length of the IDT. Note that the pitch p and the width w of the IDT fingers are measured in a direction parallel to the length L of the IDT, as defined in FIG. 1A.

In general, the IDT of an XBAR differs substantially from the IDTs used in surface acoustic wave (SAW) resonators, primarily in that IDTs of an XBAR excite a shear thickness mode, as described in more detail below with respect to FIG. 4, where SAW resonators excite a surface wave in operation. Moreover, in a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric layer 110. Moreover, the width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w, as the lithography process typically cannot support a configuration where the thickness is greater than the width. The thickness of the busbars (132, 134 in FIG. 1) of the IDT may be the same as, less than, greater than, or any combination thereof, the thickness tm of the IDT fingers. It is noted that the XBAR devices described herein are not limited to the ranges of dimensions described herein.

Moreover, unlike a SAW filter, the resonance frequency of an XBAR is dependent on the total thickness of its diaphragm (i.e., in the vertical or thickness direction), including the piezoelectric layer 110, and the front side and back side dielectric layers 212, 214 disposed thereon. In an exemplary aspect, the thickness of one or both dielectric layers can be varied to change the resonance frequencies of various XBARs in a filter. For example, shunt resonators in a ladder filter circuit may incorporate thicker dielectric layers to reduce the resonance frequencies of the shunt resonators relative to series resonators with thinner dielectric layers, and thus a thinner overall thickness.

Referring back to FIG. 2A, the thickness tfd of the front side dielectric layer 212 over the IDT fingers 238a, 238b may be greater than or equal to a minimum thickness required to deal and passivate the IDT fingers and other conductors on the front side 112 to the piezoelectric layer 110. The minimum thickness may be, for example, 10 nm to 50 nm depending on the material of the front side dielectric layer and method of deposition according to an exemplary aspect. The thickness of the back side dielectric layer 214 may be configured to a specific thickness to adjust the resonance frequency of the resonator as will be described in more detail below.

Although FIG. 2A discloses a configuration in which IDT fingers 238a and 238b are at the front side 112 of the piezoelectric layer 110, alternative configurations can be provided. For example, FIG. 2B shows an alternative configuration in which the IDT fingers 238a, 238b are at the back side 114 of the piezoelectric layer 110 (i.e., facing the cavity) and are covered by a back side dielectric layer 214. A front side dielectric layer 212 may cover the front side 112 of the piezoelectric layer 110. In exemplary aspects, a dielectric layer disposed on the diaphragm of each resonator can be trimmed or etched to adjust the resonant frequency. However, if the dielectric layer is on the side of the diaphragm facing the cavity, there may be a change in spurious modes (e.g., generated by the coating on the fingers). Moreover, with the passivation layer coated on top of the IDTs, the mark changes, which can also cause spurs. Therefore, disposing the IDT fingers 238a, 238b at the back side 114 of the piezoelectric layer 110 as shown in FIG. 2B may eliminate addressing both the change in frequency as well as the effect it has on spurs as compared when the IDT fingers 238a and 238b are on the front side 112 of the piezoelectric layer 110.

FIG. 2C shows an alternative configuration in which IDT fingers 238a, 238b are on the front side 112 of the piezoelectric layer 110 and are covered by a front side dielectric layer 212. IDT fingers 238c, 238d are also on the back side 114 of the piezoelectric layer 110 and are also covered by a back side dielectric layer 214. As previously described, the front side and back side dielectric layer 212, 214 are not necessarily the same thickness or the same material.

Figure 2D:
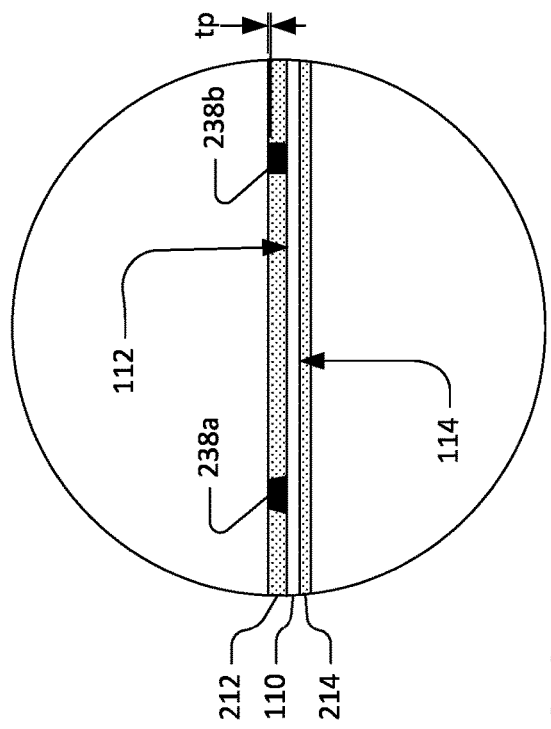
FIG. 2D is an expanded schematic cross-sectional view of another alternative configuration of the XBAR of FIG. 1A.

FIG. 2D shows another alternative configuration in which IDT fingers 238a, 238b are on the front side 112 of the piezoelectric layer 110 and are covered by a front side dielectric layer 212. The surface of the front side dielectric layer is planarized. The front side dielectric layer may be planarized, for example, by polishing or some other method. A thin layer of dielectric material having a thickness tp may cover the IDT finger 238a, 238b to seal and passivate the fingers. The dimension TP may be, for example, 10 nm to 50 nm.

FIG. 3A and FIG. 3B show two exemplary cross-sectional views along the section plane A-A defined in FIG. 1A of XBAR 100. In FIG. 3A, a piezoelectric layer 310, which corresponds to piezoelectric layer 110, is attached directly to a substrate 320, which can correspond to substrate 120 of FIG. 1A. Moreover, a cavity 340, which does not fully penetrate the substrate 320, is formed in the substrate under the portion (i.e., the diaphragm 315) of the piezoelectric layer 310 containing the IDT of an XBAR. The cavity 340 can correspond to cavity 140 of FIGS. 1A and/or 1B in an exemplary aspect. In an exemplary aspect, the cavity 340 may be formed, for example, by etching the substrate 320 before attaching the piezoelectric layer 310. Alternatively, the cavity 340 may be formed by etching the substrate 320 with a selective etchant that reaches the substrate through one or more openings provided in the piezoelectric layer 310.

FIG. 3B illustrates an alternative aspect in which the substrate 320 includes a base 322 and an intermediate layer 324 that is disposed between the piezoelectric layer 310 and the base 322. For example, the base 322 may be silicon (e.g., a silicon support substrate) and the intermediate layer 324 may be silicon dioxide or silicon nitride or some other material, e.g., an intermediate dielectric layer. That is, in this aspect, the base 322 and the intermediate layer 324 are collectively considered the substrate 320. As further shown, cavity 340 is formed in the intermediate layer 324 under the portion (i.e., the diaphragm 315) of the piezoelectric layer 310 containing the IDT fingers of an XBAR. The cavity 340 may be formed, for example, by etching the intermediate layer 324 before attaching the piezoelectric layer 310. Alternatively, the cavity 340 may be formed by etching the intermediate layer 324. In other example embodiments, the cavity 340 may be defined in the intermediate layer 324 by other means from whether the intermediate layer 324 was etched to define the cavity 340. In some cases, the etching may be performed with a selective etchant that reaches the substrate through one or more openings (not shown) provided in the piezoelectric layer 310.

In this case, the diaphragm 315, which can correspond to diaphragm 115 of FIG. 1A, for example, in an exemplary aspect, may be contiguous with the rest of the piezoelectric layer 310 around a large portion of a perimeter of the cavity 340. For example, the diaphragm 315 may be contiguous with the rest of the piezoelectric layer 310 around at least 50% of the perimeter of the cavity 340. As shown in FIG. 3B, the cavity 340 extends completely through the intermediate layer 324. That is, the diaphragm 315 can have an outer edge that faces the piezoelectric layer 310 with at least 50% of the edge surface of the diaphragm 315 coupled to the edge of the piezoelectric layer 310 facing the diaphragm 315. This configuration provides for increased mechanical stability of the resonator.

In other configurations, the cavity 340 may partially extend into, but not entirely through the intermediate layer 324 (i.e., the intermediate layer 324 may extend over the bottom of the cavity on top of the base 322) or may extend through the intermediate layer 324 and into (either partially or wholly) the base 322. As described above, it should be appreciated that the interleaved fingers of the IDT can be disposed on either or both surfaces of the diaphragm 315 in FIGS. 3A and 3B according to various exemplary aspects.

Figure 4:
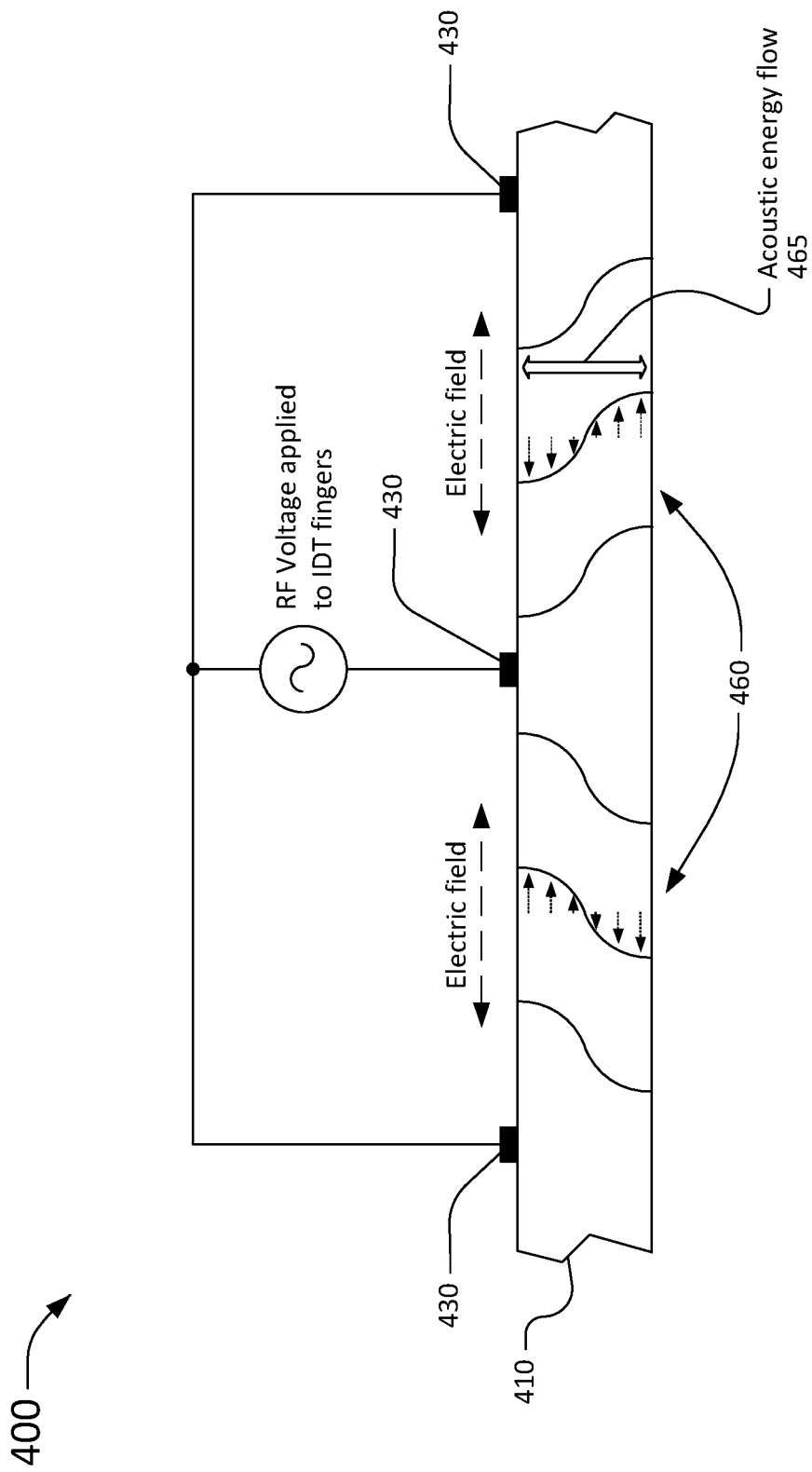
FIG. 4 is a graphic illustrating a shear horizontal acoustic mode in an XBAR.

FIG. 4 is a graphical illustration of the primarily excited acoustic mode of interest in an XBAR. FIG. 4 shows a small portion of an XBAR 400 including a piezoelectric layer 410 and three interleaved IDT fingers 430. In general, the exemplary configuration of XBAR 400 can correspond to any of the configurations described above and shown in FIGS. 2A to 2D according to an exemplary aspect. Thus, it should be appreciated that piezoelectric layer 410 can correspond to piezoelectric layer 110 and IDT fingers 430 can be implemented according to any of the configurations of fingers 238a and 238b, for example.

In operation, an RF voltage is applied to the interleaved fingers 430. This voltage creates a time-varying electric field between the fingers. The direction of the electric field is lateral (i.e., laterally excited), or primarily parallel to the surface of the piezoelectric layer 410, as indicated by the arrows labeled "electric field." Due to the high dielectric constant of the piezoelectric layer 410, the electric field is highly concentrated in the piezoelectric layer relative to the air. The lateral electric field introduces shear deformation in the piezoelectric layer 410, and thus strongly excites a shear acoustic mode, in the piezoelectric layer 410. In this context, "shear deformation" is Defined as deformation in which parallel planes in a material remain parallel and maintain a constant distance while translating relative to each other. In other words, the parallel planes of material are laterally displaced with respect to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and magnitude of atomic motion. It is noted that the degree of atomic motion, as well as the thickness of the piezoelectric layer 410, have been exaggerated for ease of visualization in FIG. 4. While the atomic motions are predominantly lateral (i.e., horizontal as shown in FIG. 4), the direction of acoustic energy flow of the primarily excited shear acoustic mode is substantially and/or primarily orthogonal to the surface of the piezoelectric layer, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 5A:
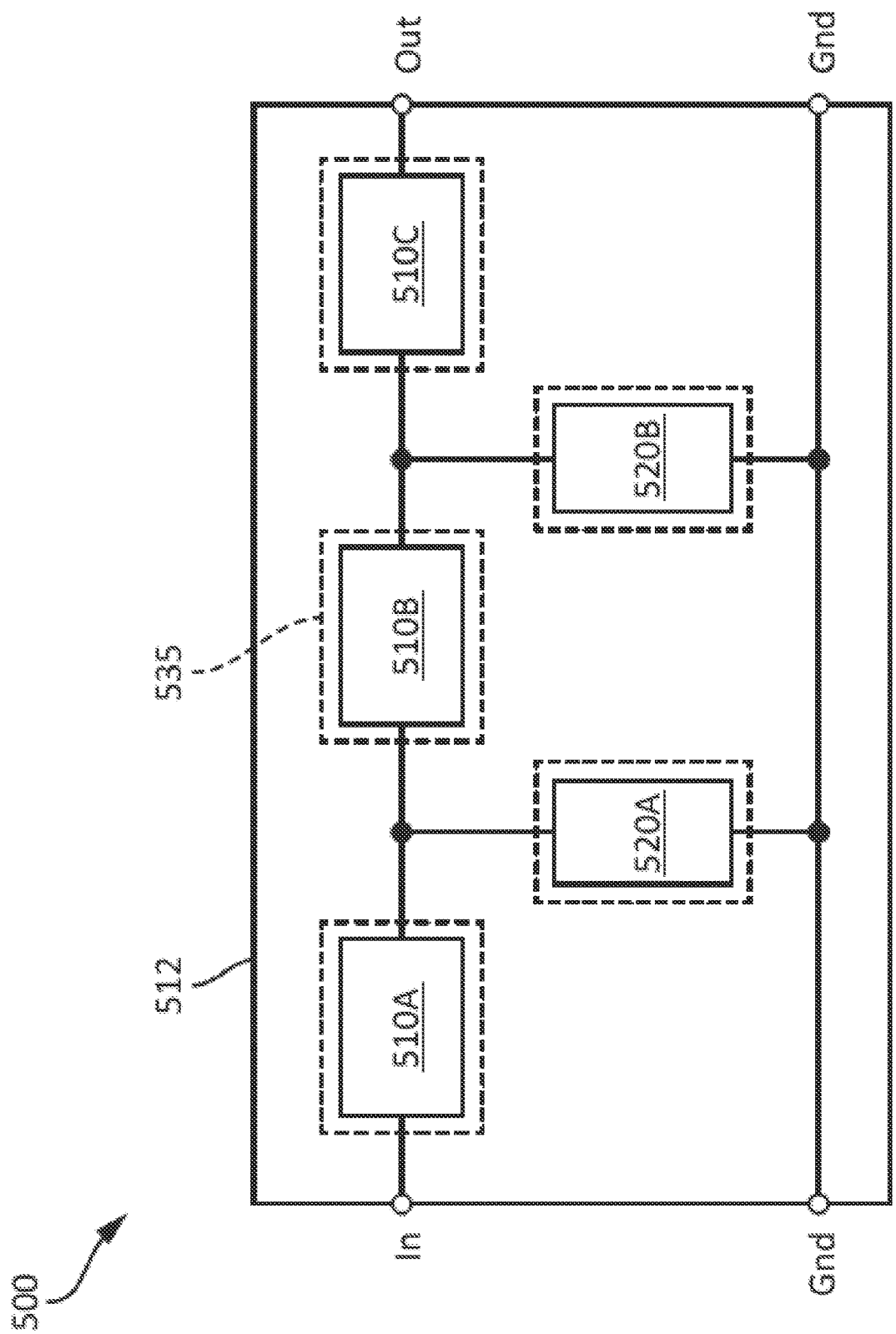
FIG. 5A is a schematic block diagram of a filter using XBARs of FIGS. 1A and/or 1B.

FIG. 5A is a schematic circuit diagram and layout for a high frequency band-pass filter 500 using XBARs, such as the general XBAR configuration 100 described above, for example. The filter 500 has a conventional ladder filter architecture including three series resonators 510A, 510B, and 510C and two shunt resonators 520A and 520B. The series resonators 510A, 510B and 510C are connected in series between a first port and a second port (hence the term "series resonator"). In FIG. 5A, the first and second ports are labeled "In" and "Out", respectively. However, the filter 500 is bidirectional and either port may serve as the input or output of the filter. The shunt resonators 520A and 520B are connected from nodes between the series resonators to ground. A filter may contain additional reactive components, such as inductors, not shown in FIG. 5A. All the shunt resonators and series resonators are XBARs (e.g., either of the XBAR configurations 100 and/or 100' as discussed above) in the exemplary aspect. The inclusion of three series and two shunt resonators is an example. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 500, the series resonators 510A, 510B and 510C and the shunt resonators 520A and 520B of the filter 500 are formed on at least one, and in some cases a single, piezoelectric layer 512 of piezoelectric material bonded to a silicon substrate (not visible). However, in alternative aspects, the individual resonators may each be formed on a separate piezoelectric layer bonded to a separate substrate, for example. Moreover, each resonator includes a respective IDT (not shown), with at least the fingers of the IDT disposed over a cavity in the substrate. In this and similar contexts, the term "respective" means "relating things each to each," which is to say with a one-to-one correspondence. In FIG. 5A, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 520A and 520B in the filter 500 has a resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are positioned above the upper edge of the passband.

The frequency range between resonance and anti-resonance frequencies of a resonator corresponds to the coupling of the resonator. Depending on the design parameters of the filter 500, each of the resonators 510A, 510B, 510C, 520A and 520B may have a particular coupling parameter to which the respective resonator is tuned in order to achieve the required frequency response of the filter 500.

According to an exemplary aspect, each of the series resonators 510A, 510B, and 510C and the shunt resonators 520A and 520B can have an XBAR configuration as described above with respect to FIGS. 1-3 in which a diaphragm with IDT fingers spans over a cavity. Moreover, each of the series resonators 510A, 510B, and 510C and the shunt resonators 520A and 520B can also have the lid structure and particular configuration for thermal transport of FIG. 6 as will be discussed below.

Figure 5B:
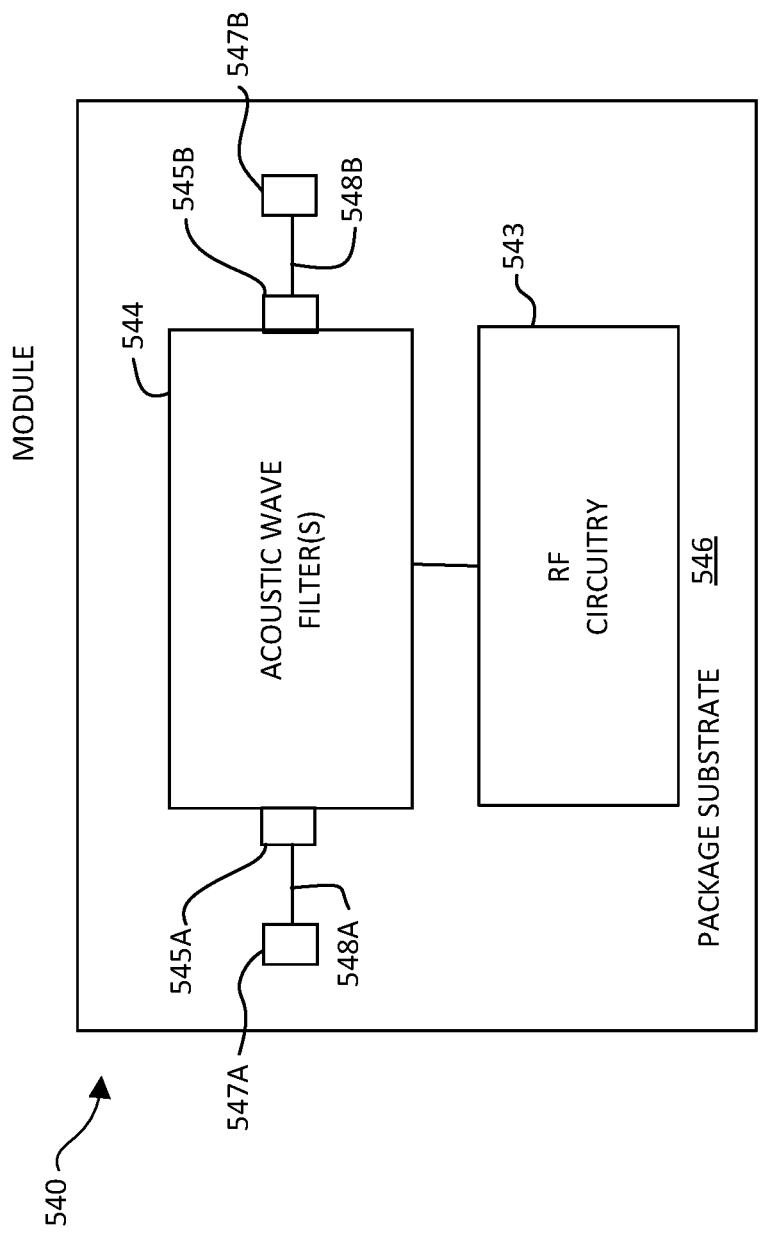
FIG. 5B is a schematic diagram of a radio frequency module that includes an acoustic wave filter device according to an exemplary aspect.

FIG. 5B is a schematic diagram of a radio frequency module that includes an acoustic wave filter device according to an exemplary aspect. In particular, FIG. 5B illustrate a radio frequency module 540 that includes one or more acoustic wave filters 544 according to an exemplary aspect. The illustrated radio frequency module 540 also includes radio frequency (RF) circuitry (or circuit) 543. In an exemplary aspect, the acoustic wave filters 544 may include one or more of filter 500 including XBARs, as described above with respect to FIG. 5A. In an exemplary aspect, the acoustic wave filter 544 may include one or more acoustic wave resonators with a lid structure for thermal transport and configuration of FIG. 6 as will be discussed below.

The acoustic wave filter 544 shown in FIG. 5B includes terminals 545A and 545B (e.g., first and second terminals). The terminals 545A and 545B can serve, for example, as an input contact and an output contact for the acoustic wave filter 544. Although two terminals are illustrated, any suitable number of terminals can be implemented for a particular application. The acoustic wave filter 544 and the RF circuitry 543 are on a package substrate 546 (e.g., a common substrate) in FIG. 5B. The package substrate 546 can be a laminate substrate. The terminals 545A and 545B can be electrically connected to contacts 547A and 547B, respectively, on the package substrate 546 by way of electrical connectors 548A and 548B, respectively. The electrical connectors 548A and 548B can be bumps or wire bonds, for example. In an exemplary aspect, the acoustic wave filter 544 and the RF circuitry 543 may be enclosed together within a common package, with or without using the package substrate 546.

The RF circuitry 543 can include any suitable RF circuitry. For example, the RF circuitry can include one or more radio frequency amplifiers (e.g., one or more power amplifiers and/or one or more low noise amplifiers), one or more radio frequency switches, one or more additional RF filters, one or more RF couplers, one or more delay lines, one or more phase shifters, or any suitable combination thereof. The RF circuitry 543 can be electrically connected to the one or more acoustic wave filters 544. The radio frequency module 540 can include one or more packaging structures to, for example, provide protection and/or facilitate easier handling of the radio frequency module 540. Such a packaging structure can include an overmold structure formed over the package substrate 546. The overmold structure can encapsulate some or all of the components of the radio frequency module 540.

According to the exemplary aspects and configurations described above, the XBAR acoustic resonators (e.g., configurations 100 and 100') include a piezoelectric layer (or plate) that forms a diaphragm over a cavity of the acoustic resonator. However, such acoustic resonator that are based on free-standing membranes often have a large thermal impedance for heat dissipated during high power operation. This limits operating power and product lifetime. In an exemplary aspect, the hermetic packaging of frontside etch based acoustic filters in a helium, or other high thermal conductivity gas, environment can be used to increase thermal conduction from membrane to substrate.

With these configurations, there are two primary heat conduction channels for acoustic resonators (e.g., XBARs): lateral conduction on the membrane, primarily in the electrodes, and vertical conduction through an air (e.g., a gas) cavity between the membrane (e.g., the piezoelectric layer) and substrate. To improve the former path, narrowing of the resonator aperture may be used, but this modification may also degrade the acoustic Q factor. To improve the latter, the air cavity may be made shallower, but such modifications can reduce effective acoustic coupling and risk incomplete release of the piezoelectric layer from the substrate. Moreover, utilization of a higher thermal conductivity gas, such as helium or neon, allows aperture and cavity dimensions to remain optimal, while improving heat sinking.

Hermetically sealed acoustic filters may also comprise various substrates, lids and bonding materials, provided it is hermetic in enclosing helium gas. Electrical routing may pass through the lid (e.g., formed of silicon) with through silicon vias ("TSVs"). Moreover, helium gas in the cavity may be provide six times higher thermal conductivity than air, and thus, the cavity height can possibly be reduced by six times with helium in place of air. The cavity may also have holes or perforations that allow for helium in the packaging environment and hermetic cavity to fill the cavity between membrane and substrate.

According to an exemplary aspect, neon and helium enable a 30% reduction in thermal resistance relative to back side etch (BSE) cavity for approximately 2.0 µm and 6.0 µm front side etch (FSE) cavity depths, respectively, in comparison to 1.0 µm cavity depth with air. Moreover, for a 1.0 µm FSE cavity depth, neon and helium provide for respective thermal resistance reductions of 45% and 72%, respectively, compared to the BSE cavity. As such, the effective range of usable cavity depths may be estimated from 0.5 µm to 5.0 µm, depending on the gas filled in the cavity and the acceptable parasitic capacitance.

As will be described in greater detail below, the packaging for the acoustic resonator can be a package device or structure in addition to the resonator and in which the resonator is mounted or coupled to according to an exemplary aspect. In addition, the package can include a cavity below the membrane or piezoelectric layer of the resonator. The cavity may be front side etched (FSE) or back side etched (BSE). The hermetically sealed configuration may be a gas tight seal, an airtight seal and/or a liquid tight seal according to an exemplary aspect.

Figure 6:
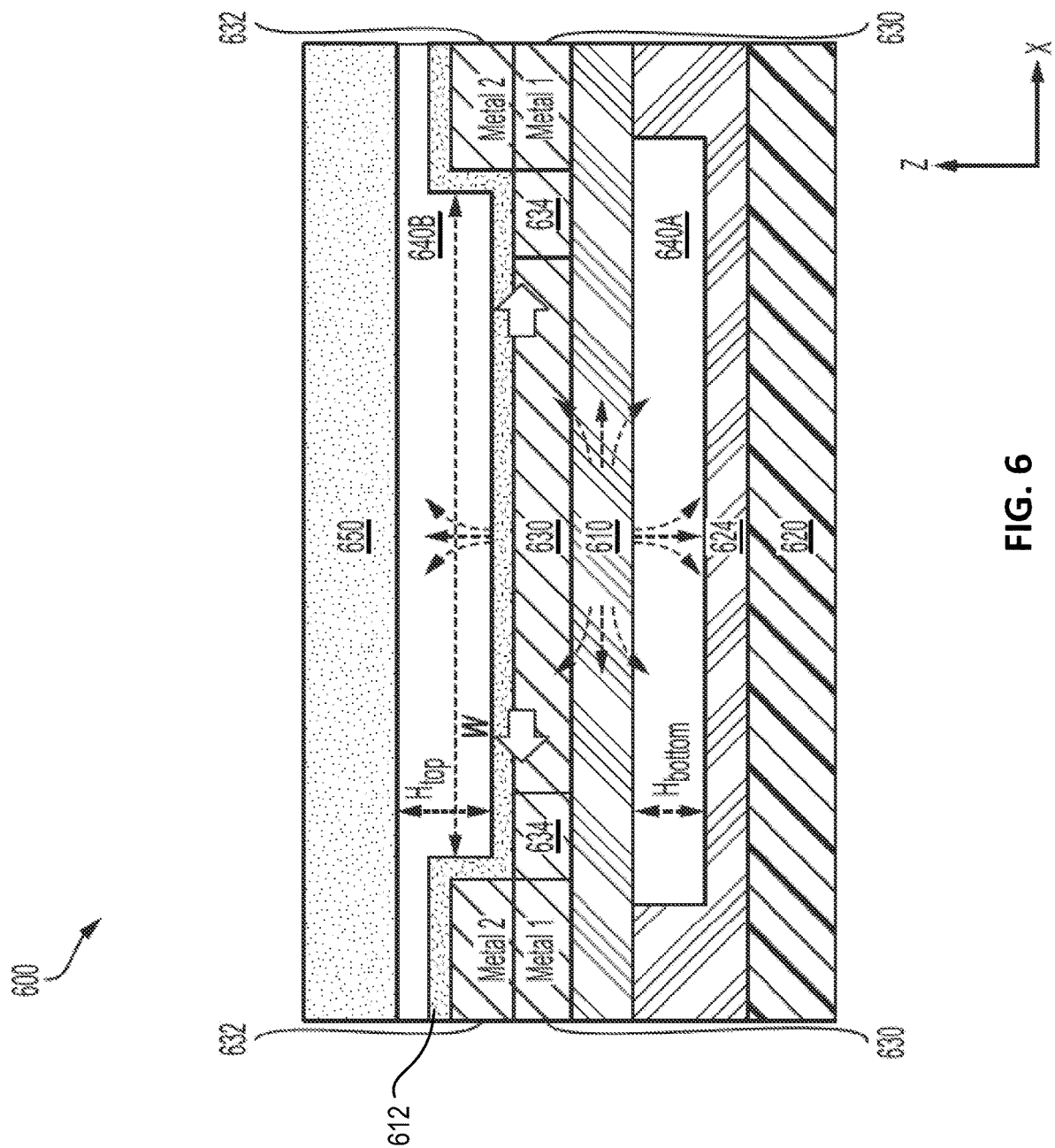
FIG. 6 is a schematic cross-sectional view of an acoustic resonator 600 with a lid 630 for improved thermal transport according to an exemplary aspect.

In particular, FIG. 6 is a schematic cross-sectional view of an acoustic resonator 600 with a lid 650 for improved thermal transport according to an exemplary aspect. It should be appreciated that the acoustic resonator 600 of FIG. 6 can correspond substantially to the acoustic resonator 100 of FIG. 1A and/or the acoustic resonator 100' of FIG. 1B. Moreover, the acoustic resonator 600 can generally have any of the IDT configurations described above with respect to FIGS. 2A to 2D, although FIG. 6 illustrates a similar configuration as described above and shown in FIG. 2A in which the IDT is on a surface of the piezoelectric layer 610 that is opposite the substrate 620.

As shown, the acoustic resonator 600 includes a substrate 620 and a piezoelectric layer 610 that is coupled to the substrate 620 by one or more dielectric layers, such as dielectric layer 624. In an exemplary aspect, substrate 620 can correspond to substrate 120 and piezoelectric layer 610 can correspond to piezoelectric layer 110 as described above. Moreover, similar to the configuration of FIG. 1B, a cavity 640A is disposed at least partially in the dielectric layer 624. Although not shown in FIG. 6, the cavity 640A may be fully within the dielectric layer 624 as discussed above in reference to FIG. 1B.

In an exemplary aspect, the piezoelectric layer 610 can include a piezoelectric material, such as lithium niobate, lithium tantalate, lanthanum gallium silicate, gallium nitride, or aluminum nitride. Moreover, the dielectric layer 624 can be a silicon dioxide layer that is formed on the substrate 620, which can be silicon, such that cavity 640A is formed in the silicon dioxide layer 624. Cavity 640A can be considered a back side etch (BSE) cavity and is also referred to as a lower (or second) cavity according to this disclosure.

As further shown, the acoustic resonator 600 includes an interdigital transducer (IDT) 630 coupled to the piezoelectric layer 610. In one implementation, the IDT 630 is coupled to an upper surface of the piezoelectric layer 610 such that an upper (or first) cavity 640B, which can also be considered a front side etch (FSE) cavity, is formed above the IDT 630. In another implementation, the IDT 630 can be coupled to a lower surface of the piezoelectric layer 610 (that is opposite of the upper surface) such that the lower (or second) cavity 640A is formed between the IDT 630 and the substrate 620, i.e., the IDT 630 is facing the substrate 620, which can also include dielectric layer 624, such as silicon dioxide, disposed thereon. In one or more implementations, the XBAR 600 may include a first IDT coupled to the upper surface of the piezoelectric layer 610 and a second IDT coupled to the lower surface of the piezoelectric layer 610, similar to the configuration shown in FIG. 2C and described above. As also described above, the IDT 630 includes a plurality of interleaved fingers. As described above with respect to FIG. 4, radio frequency signals may be applied to the IDT to excite a primarily shear acoustic mode with the plurality of interleaved fingers in at least a portion of the piezoelectric layer 610.

According to the exemplary aspect, the acoustic resonator 600 includes a lid 650 that is arranged relative to the piezoelectric layer 610. In an exemplary aspect, the lid 650 can comprises a semiconductor material (e.g., silicon) that provides a protective cover for the acoustic resonator and is also formed of a material configured for sufficient heat dissipation. As further shown in the exemplary aspect, the piezoelectric layer 610 is arranged between the substrate 620 and the lid 650 with an upper (or first) cavity 640B having a first height (denoted as $H_{TOP}$) between a bottom surface the lid 650 and an upper or first main (or principal) surface of the piezoelectric layer 610 in the thickness direction (e.g., Z direction) and a lower (or second) cavity 640A having a second height (denoted as $H_{BOTTOM}$) between the dielectric layer 624 and a lower or second main (or principal) surface of the piezoelectric layer 610 the thickness direction (e.g., Z direction), where the first and second main surfaces (i.e., the upper and lower surfaces) oppose each other in the thickness direction (e.g., Z direction). As further shown, a dielectric layer 612 (e.g., silicon dioxide) can be formed on the metal layer (i.e., the IDT) 630 of the piezoelectric layer 610 in an exemplary aspect. Thus, the upper cavity 640B can be formed in the dielectric layer 612, for example. When the dielectric layer 612 is provided on the piezoelectric layer 610, the first height ($H_{TOP}$) is measured between a bottom surface of the lid 650 and an upper surface of the dielectric layer 612 that faces the lid 650.

It should also be generally appreciated that the height ($H_{TOP}$) of the first cavity 640B and the height ($H_{BOTTOM}$) of the second cavity 640A are measured in a thickness direction (e.g., the Z axis direction) of the acoustic resonator, which can be considered a direction substantially and/or predominantly perpendicular to a surface of the piezoelectric layer 610 (i.e., the Z direction). That is, for purposes of this disclosure, the term "perpendicular" may be considered 90 degrees±10 degrees from the corresponding surface(s) from which it is measure. Moreover, the first height ($H_{TOP}$) of the cavity 640B can be defined by a corresponding thickness (i.e., in the Z direction) of one or more metal layers 632 (e.g., metal 2) that are deposited on the conductor pattern 630 (e.g., metal 1). The one or more metal layers 632 can be a same or different metal material than the conductor pattern 630. Moreover, another dielectric 634 can be deposited to surround the IDT structure (e.g., conductor pattern 630). It should be appreciated that the dielectric layer 612 is uniformly deposited in the exemplary aspect. Thus, the height of one or more metal layers 632 can be predefined during the deposition process to correspond to and precisely define the first height ($H_{TOP}$) of the cavity 640B. The one or more metal layers 632 will effectively have a frame shape with an inner surface that define the first cavity 640B between the lid 650 and the piezoelectric layer 610. It is also noted that while a space is shown between dielectric layer 612 and lid 650 for illustration purposes, the lid 650 can be directly coupled to dielectric layer 612 in an exemplary aspect.

Moreover, the upper cavity 640B and the lower cavity 640A can be filled with a gas with a high thermal conductivity that increases thermal conduction through the upper cavity 640B and the lower cavity 640A. For example, the gas filled in the cavity can be helium or neon to improve the thermal diffusivity as discussed above. In one or more implementations, the lid 650 is arranged with a distance (i.e., first height amp) to an upper surface of the dielectric layer 612 that increases thermal conduction between the piezoelectric layer 610 and the lid 650 based on a relationship between the first height, amp, and the second height, $H_{BOTTOM}$. Although not sure, a thin dielectric layer may also be formed on the lower surface of the piezoelectric layer 610 facing the dielectric layer 624, for example, as shown in FIG. 1B. In this case, the second height, $H_{BOTTOM}$, would still be measured as the height of the cavity 640A.

In general, losses in XBAR devices, such as acoustic resonator 600, can result in thermal energy increases (or heating) of the piezoelectric layer 610. Heat flows out through multiple thermal conduction channels formed within the acoustic resonator 600. In a first thermal conduction channel, heat may flow out of an aperture (W) of the piezoelectric layer 610 to a metal structure that forms part of an IDT finger (denoted as metal 630) and then flows toward the substrate 620. This first thermal conduction channel (e.g., as shown in the lateral dashed arrows of the piezoelectric layer 610) can scale proportional to a device width. In a second thermal conduction channel (e.g., as shown in the vertical downward facing dashed arrows), heat may further flow away from the piezoelectric layer 610 towards the substrate 620 through the gas filled in the lower cavity 640A. This second thermal conduction channel can scale proportional to the device area and cavity depth (or the cavity height, $H_{BOTTOM}$) of the lower (or second) cavity 640A. The cavity height of the lower cavity 640A may be in a range of about 0.5 μm to about 10.0 μm in an exemplary aspect. If the lid 650 is arranged in close proximity to the piezoelectric layer 610, substantial heat may conduct from the piezoelectric layer 610 to the lid 650 through the gas filled in the upper cavity 640B. This third thermal conduction channel (e.g., as shown in the vertical upward facing dashed arrows) can scale proportional to the device area and the distance between the piezoelectric layer 610 and the lid 650 (or defined by the height of the upper cavity 640B, $H_{TOP}$).

According to the exemplary aspect, the use of and positioning the lid 650 as illustrated in FIG. 6 can be arranged to be in close proximity to the piezoelectric layer 610 so that the first height H TOP of the upper (or first) cavity 640B is substantially similar to the second height $H_{BOTTOM}$ of the lower (or second) cavity 640A, resulting in the third thermal conduction channel (e.g., as shown in the vertical upward facing dashed arrows) carrying a heat load that corresponds to that of the second thermal conduction channel.

According to the exemplary aspect, the thermal conductance of the gas layer within either of the upper cavity 640B or the lower cavity 640A may be defined as the thermal conductivity of the gas times ((area of the cavity)/(height of the cavity)). The thermal conductivity and area may be the same between the top and bottom of the piezoelectric layer 610. Accordingly, there may be a limited benefit to the use of the lid 650 when the first height of the upper (or first) cavity 640B (amp) is configured to be at least four times greater than the second height of the lower (or second) cavity 640A ($H_{BOTTOM}$). In particular, the thermal conductivity of the top channel (or first thermal conduction channel) defined by the first height of the upper cavity 640B is less than a quarter of the thermal conductivity of the bottom channel (or second thermal conduction channel) defined by the second height of the lower cavity 640A. In this regard, the distance from the lid 650 to the first main surface of the piezoelectric layer 610 (or the dielectric layer 612 if provided) may be up to four times greater than the second height of the lower cavity 640A ($H_{BOTTOM}$) according to the exemplary aspect.

Moreover, it is noted that the greatest quantity of heat flow may occur as the first height of the upper (or first) cavity 640B ($H_{TOP}$) is reduced to about zero (or to negligible height). However, arranging the lid 650 too close in proximity to the piezoelectric layer 610 will add significant capacitance and/or loss in the acoustic resonator 600. Thus, in the exemplary aspect, the first height of the upper (or first) cavity 640B ($H_{TOP}$) is set to be greater than about 1 multiple of the pitch of the IDT of the acoustic wave resonator structures. This is because the capacitance of the lid 650 can be detrimental if first height of the upper (or first) cavity 640B ($H_{TOP}$) becomes less than the pitch. On the piezoelectric layer 610, an electric field is present that oscillates at twice the pitch, so the wavenumber can be defined as $k=2\pi/(2\times pitch)$, which can be simplified as $k=\pi/pitch$. In this regard, the electric field can decay away from the piezoelectric layer 610 as $e^{-kz}$, so for every multiple of distance away from the piezoelectric layer 610 in terms of $\pi/pitch$, the electric field may decrease by about 1/e, or about 0.37. This is because a solution to Laplace's equation is $e^{ikx}e^{-kz}$, where x is the distance along the piezoelectric layer 610 (e.g., the oscillation is about twice the pitch) and z is the distance moving away from the piezoelectric layer 610. Capacitance can be proportional to the square of the electric field, so the capacitance can increase significantly as the first height of the upper (or first) cavity 640B ($H_{TOP}$) converges to or becomes smaller than the acoustic resonator pitch.

Figure 7:
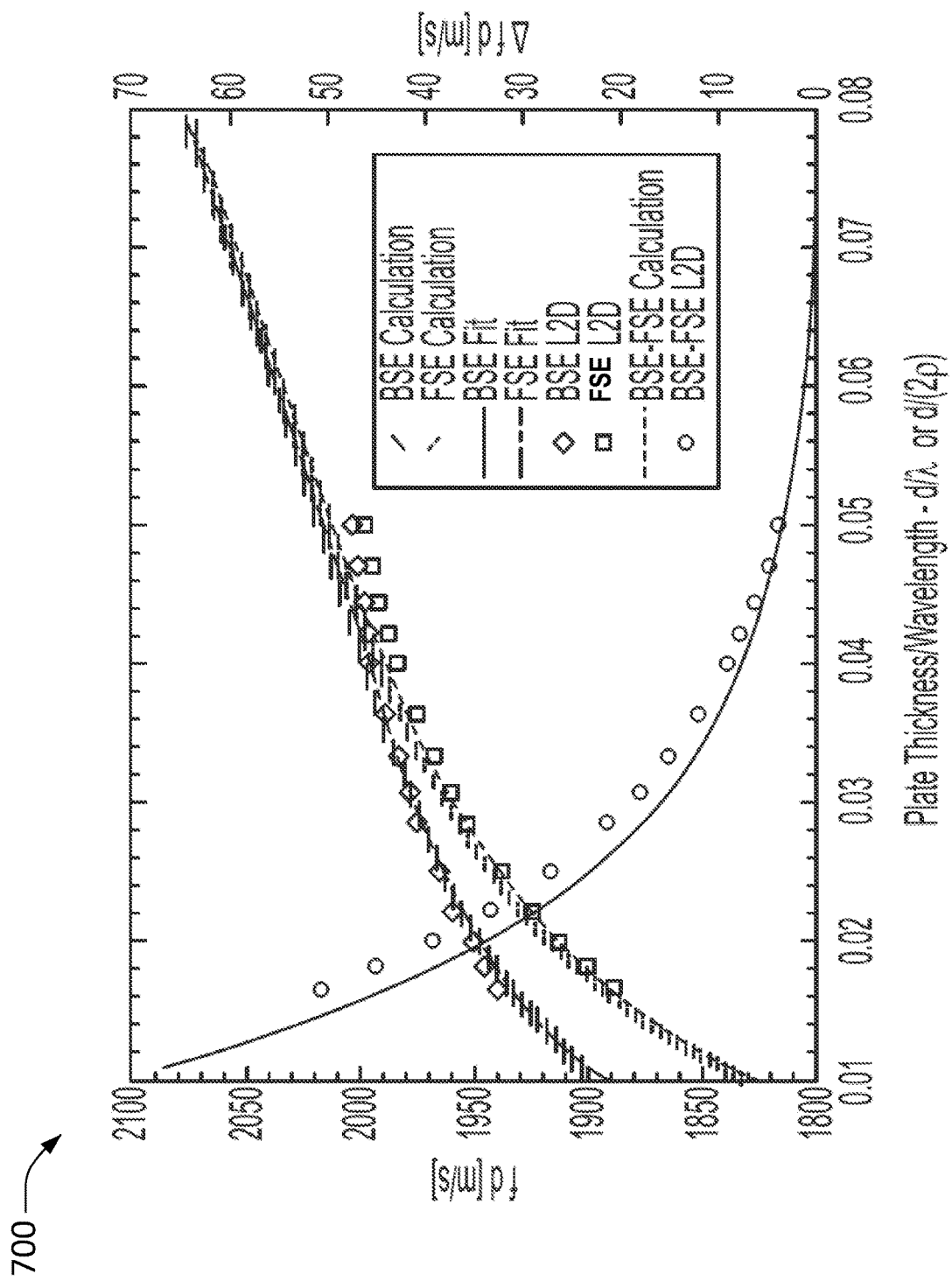
FIG. 7 illustrates shows an exemplary graph of capacitance relative to plate thickness over wavelength according to an exemplary aspect.

FIG. 7 shows an exemplary graph of the antiresonance frequency normalized by the plate thickness d relative to plate thickness over wavelength according to an exemplary aspect. The antiresonance frequency is sensitive to parasitic capacitance while the resonance frequency (not shown) is not. Any reduction in antiresonance frequency translates directly to a reduction in coupling. In particular, the X axis of the graph 700 illustrates the plate thickness d (e.g., thickness in the Z direction of the piezoelectric layer 610) over the wavelength λ of the piezoelectric material, which can also be considered the plate thickness d over two times the pitch ρ of the interleaved fingers of the acoustic resonator. Thus, the larger pitches are to the left of the X axis in graph 700. Typically, the effect of the capacitance from the bottom cavity 640A would be the same from the top cavity 640B.

The plots compare the antiresonance frequency of two structures both with a lid infinitely far away. One, the back side etch (BSE), has a bottom cavity infinitely deep, while the other, the front side etch (FSE), has a finite cavity depth. As can be seen from the drop (e.g., in the Y axis direction) from the points of the BSE to the points of the FSE, the antiresonance frequency is lowered when the material is close to the bottom of the plate. This change in antiresonance frequency between BSE and FSE structures is due to the parasitic capacitance of the material near the bottom of the plate and indicates the material of the bottom cavity is too close to the piezoelectric layer and adds unwanted capacitance. Moreover, as the plots move from the right to the left in the X axis direction, the points of the FSE starts to deviate from the points of the BSE at approximately the pitch ρ that is comparable to the material distance. As such, the height ($H_{BOTTOM}$) of the cavity 640A should also be equal to or greater than the pitch ρ of at least one pair of interleaved fingers of the plurality of interleaved fingers to minimize the effect of the unwanted capacitance. This result also applies when a lid is considered. As the lid is brought close to the plate, it will introduce unwanted capacitance when the height ($H_{TOP}$) becomes close in value to the pitch. Therefore, the height ($H_{TOP}$) of the cavity 640B should also be at least equal to or greater than the pitch ρ of at least one pair of interleaved fingers of the plurality of interleaved fingers to minimize the effect of the unwanted capacitance.

Figure 8:
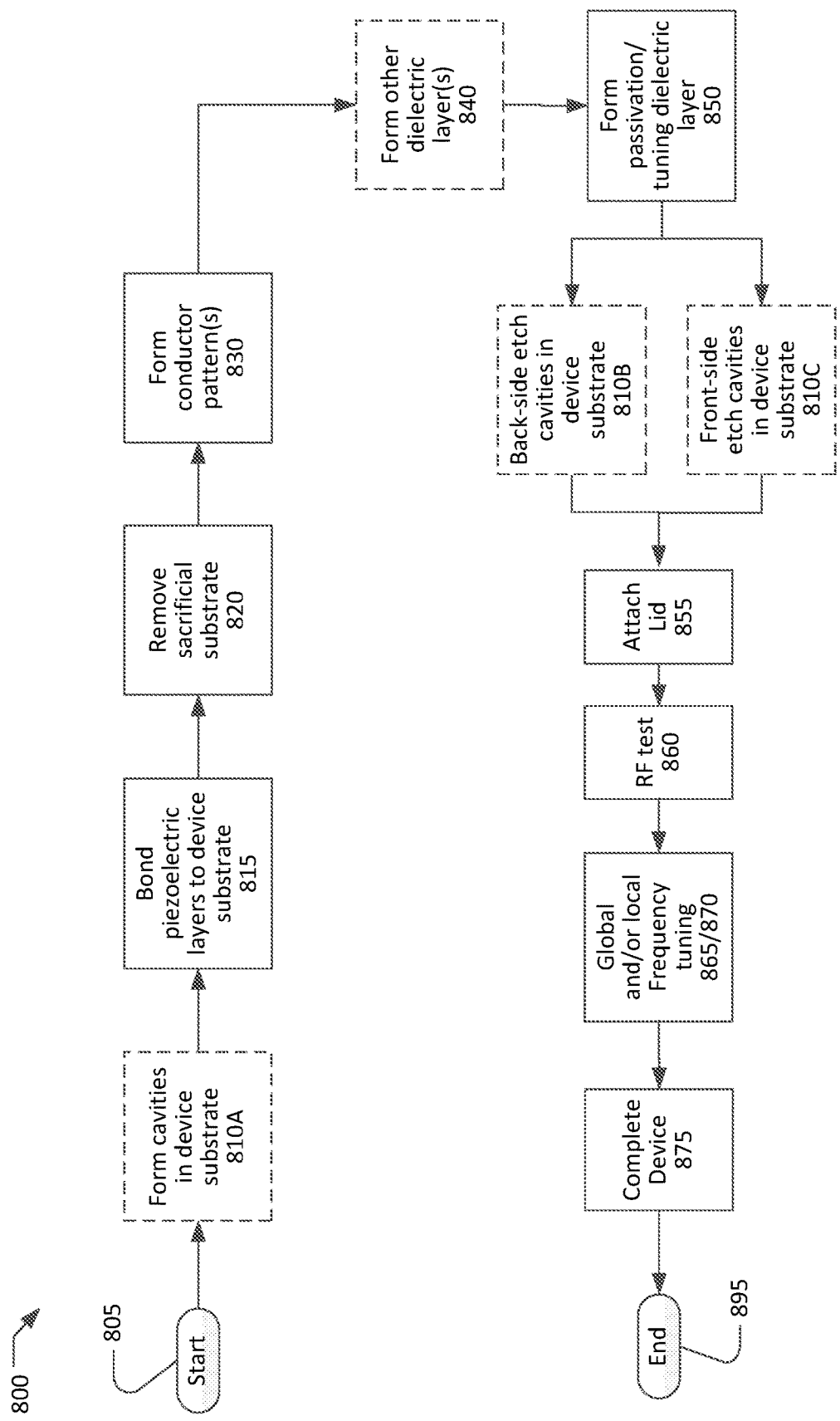
FIG. 8 illustrates a flowchart of a method of manufacturing a filter as described herein according to an exemplary aspect.

FIG. 8 illustrates a flowchart of a method 800 of manufacturing a filter as described herein according to an exemplary aspect. In particular, method 800 summarizes an exemplary manufacturing processing for fabricating a filter device incorporating the XBARs with a lid for improved thermal transport according to an exemplary aspect. Specifically, the process 800 for fabricating a filter device including multiple XBARs having the lid structure for thermal transport as described herein. The process 800 starts at 805 with a device substrate and thin layers of piezoelectric material disposed on a sacrificial substrate. The process 800 ends at 895 with a completed filter device.

It is noted that the flow chart 800 of FIG. 8 includes only major process steps. Various conventional process steps (e.g., surface preparation, cleaning, inspection, baking, annealing, monitoring, testing, etc.) may be performed before, between, after, and during the steps shown in FIG. 8. It is noted that at 805, a material layer (e.g., a floating metal layer for the capacitor as described above) may be deposited on the piezoelectric material before it is coupled to the sacrificial substrate.

Moreover, it is noted that while FIG. 8 generally describes a process for fabricating a single filter device, multiple filter devices may be fabricated simultaneously on a common wafer (including a piezoelectric layer bonded to a substrate). In this case, each step of the process 800 may be performed concurrently on all of the filter devices on the wafer.

The flow chart of FIG. 8 captures three variations of the process 800 for making an XBAR which differ in when and how cavities are formed in the device substrate. The cavities may be formed at steps 810A, 810B, or 810C. It should be appreciated that only one of these steps is performed in each of the three variations of the process 800.

In one variation of the process 800, one or more cavities are formed in the device substrate at 810A, before the piezoelectric layers are bonded to the substrate at 815. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities may be formed using conventional photolithographic and etching techniques. Typically, the cavities formed at 810A will not penetrate through the device substrate.

At 815, the piezoelectric layers are each bonded to the device substrate or indirectly to a dielectric layer as described above. The piezoelectric layers and the device substrate may be bonded by a wafer bonding process. Typically, the mating surfaces of the device substrate and the piezoelectric layers are highly polished. One or more layers of intermediate materials, such as an oxide or metal, may be formed or deposited on the mating surface of one or both of the piezoelectric layer and the device substrate. One or both mating surfaces may be activated using, for example, a plasma process. The mating surfaces may then be pressed together with considerable force to establish molecular bonds between the piezoelectric layer and the device substrate or intermediate material layers.

At 820, the sacrificial substrate may be removed. For example, the piezoelectric layers and the sacrificial substrate may be wafers of piezoelectric material that have been ion implanted to create defects in the crystal structure along a plane that defines a boundary between what will become the piezoelectric layer and the sacrificial substrate. At 820, the wafer may be split along the defect plane, for example by thermal shock, detaching the sacrificial substrate and leaving the piezoelectric layer bonded to the device substrate. The exposed surface of the piezoelectric layers may be polished or processed in some manner after the sacrificial substrate is detached.

A first conductor pattern, including IDTs of each XBAR and the capacitor electrodes, is formed at 830 by depositing and patterning one or more conductor layers on a front side of one of the piezoelectric layer (e.g., piezoelectric layer 610). The conductor layer may be, for example, aluminum, an aluminum alloy, copper, a copper alloy, or some other conductive metal. In some aspects, one or more layers of other materials may be disposed below (i.e., between the conductor layer and the piezoelectric layer) and/or on top of the conductor layer. For example, a thin film of titanium, chrome, or other metal may be used to improve the adhesion between the conductor layer and the piezoelectric layer. A second conductor pattern of gold, aluminum, copper or other higher conductivity metal may be formed over portions of the first conductor pattern (for example the IDT bus bars and interconnections between the IDTs).

Each conductor pattern may be formed at 830 by depositing the conductor layer and, in some aspects, one or more other metal layers in sequence over the surface of the piezoelectric layer. The excess metal may then be removed by etching through patterned photoresist. The conductor layer can be etched, for example, by plasma etching, reactive ion etching, wet chemical etching, or other etching techniques.

Alternatively, each conductor pattern may be formed at 830 using a lift-off process. Photoresist may be deposited over the piezoelectric layer and patterned to define the conductor pattern. It should be appreciated that the photoresist for the conductor pattern can be defined to achieve the desired chirping configurations as described above. Moreover, the conductor layer and, in some aspects, one or more other layers may be deposited in sequence over the surface of the piezoelectric layer. The photoresist may then be removed, which removes the excess material, leaving the conductor pattern.

At 840, one or more dielectric layers may be formed on one or both opposing surfaces of the piezoelectric layer and conductor patterns. These layers can be deposited and trimmed to configure the resonant frequency according to exemplary aspects.

At 850, a passivation/tuning dielectric layer (e.g., layer 612 of FIG. 6) may be deposited over the piezoelectric layers and conductor patterns. The passivation/tuning dielectric layer may cover the entire surface of the filter except for pads for electrical connections to circuitry external to the filter. In some instantiations of the process 800, the passivation/tuning dielectric layer may be formed after the cavities in the device substrate and/or the intermediate layer are etched at either 810B or 810C.

More particularly, in a second variation of the process 800, one or more cavities are formed in the back surface of the device substrate and/or the intermediate layer at 810B. A separate cavity may be formed for each resonator in a filter device. Also, the cavities can be shaped and formed such that plurality of resonators can be on one diaphragm over one cavity. These resonators sharing a diaphragm are acoustically coupled on an acoustic track. The one or more cavities may be formed using an anisotropic or orientation-dependent dry or wet etch to open holes through the back side of the device substrate to the piezoelectric layer. In this case, the resulting resonator devices will have a cross-section as shown in FIG. 1A or FIG. 1B.

In a third variation of the process 800, one or more cavities in the form of recesses in the device substrate may be formed at 810C by etching the substrate using an etchant introduced through openings in the piezoelectric layer. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities formed at 810C will not penetrate through the device substrate.

In any case, at 855, a lid is prepared and attached to the acoustic resonator according to an exemplary aspect. As described above with respect to FIG. 6, the lid 650 is prepared and coupled to the acoustic resonator such that a height H TOP of the cavity 640B is configured for thermal transport. For example, the height of metal layer 632 can be configured to define the depth of the upper cavity (e.g., cavity 640B), such that when the lid 650 is coupled thereto, the height between the lid and the main surface of the dielectric layer on top of the piezoelectric layer is greater than a pitch of at least one pair of interleaved fingers and at most four times greater than the height of the lower cavity (e.g., cavity 640A).

Ideally, after the lower cavities (e.g., cavity 640A) are formed at 810B or 810C, most or all of the filter devices on a wafer will meet a set of performance requirements. However, normal process tolerances will result in variations in parameters such as the thicknesses of dielectric layers formed at 840 and 850, variations in the thickness and line widths of conductors and IDT fingers formed at 830, and variations in the thickness of the piezoelectric layer. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 850. The frequency of a filter device passband can be lowered by adding material to the passivation/tuning layer, and the frequency of the filter device passband can be increased by removing material from the passivation/tuning layer. Typically, the process 800 is biased to produce filter devices with passbands that are initially lower than a required frequency range but can be tuned to the desired frequency range by removing material from the surface of the passivation/tuning layer.

At 860, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric layer and substrate.

At 865, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 860 may be processed to generate a global contour map indicating the amount of material to be removed as a function of two-dimensional position on the wafer. The material is then removed in accordance with the contour map using the selective material removal tool.

At 870, local frequency tuning may be performed in addition to, or instead of, the global frequency tuning performed at 865. "Local" frequency tuning is performed with a spatial resolution smaller than an individual filter device. The test results from 860 may be processed to generate a map indicating the amount of material to be removed at each filter device. Local frequency tuning may require the use of a mask to restrict the size of the areas from which material is removed. For example, a first mask may be used to restrict tuning to only shunt resonators, a second mask may be subsequently used to restrict tuning to only series resonators, and a third mask may be subsequently used to restrict tuning to only extracted pole resonators. This would allow independent tuning of the lower band edge and upper band edge of the filter devices.

After frequency tuning at 865 and/or 870, the filter device is completed at 875. Actions that may occur at 875 include forming bonding pads, metal traces, and/or solder bumps or other means for making connection between the device and external circuitry (if such pads were not formed at 830); excising individual filter devices from a wafer containing multiple filter devices; other packaging steps; and additional testing. After each filter device is completed, the process ends at 895.

In general, it is noted that throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, the pair of terms "top" and "bottom" can be interchanged with the pair "front" and "back" or "first" and "second". Moreover, as used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

As used herein, "and/or" means that the listed items are alternatives, but the alternatives also include any combination of the listed items.

What is claimed:

1. An acoustic resonator comprising:
a piezoelectric layer;
an interdigital transducer (IDT) at a surface of the piezoelectric layer and comprising a plurality of interleaved fingers;
a lid disposed above the piezoelectric layer and defining a first cavity between the lid and the piezoelectric layer;
a substrate disposed below the piezoelectric layer opposite the lid; and
a dielectric layer disposed between the substrate and the piezoelectric layer and having a second cavity extending at least partially therein,
wherein a height of the first cavity is greater than a pitch of at least two interleaved fingers of the plurality of interleaved fingers and at most four times greater than a height of the second cavity.

2. The acoustic resonator of claim 1, wherein the height of the first cavity is greater than or equal to the height of the second cavity.

3. The acoustic resonator of claim 1, wherein the pitch corresponds to a center-to-center spacing between the at least two interleaved fingers.

4. The acoustic resonator of claim 1, wherein a thermal conduction between the piezoelectric layer and the lid corresponds to a thermal conduction through the first cavity based on a distance between the lid and the piezoelectric layer being configured to correspond to the height of the first cavity.

5. The acoustic resonator of claim 1, wherein a thermal conduction between the piezoelectric layer and the lid forms a thermal conduction channel that is proportional to an area of the first cavity and the height of the first cavity.

6. The acoustic resonator of claim 1, wherein the lid comprises a semiconductor material.

7. The acoustic resonator of claim 1, wherein the piezoelectric layer and the IDT is configured such that a respective radio frequency signal applied to the IDT primarily excites a shear acoustic mode within the piezoelectric layer.

8. The acoustic resonator of claim 1, further comprising a gas filled in the first cavity and the second cavity that is configured to increase thermal conduction through the first cavity and the second cavity.

9. The acoustic resonator of claim 1, wherein the height of each of the first cavity and the second cavity is measured in a direction substantially and/or predominantly perpendicular to the surface of the piezoelectric layer.

10. The acoustic resonator of claim 1, further comprising a metal layer disposed between the lid and the piezoelectric layer, such that an inner surface of the metal layer defines the first cavity between the lid and the piezoelectric layer.

11. The acoustic resonator of claim 10, further comprising an additional dielectric layer on the IDT and between the interleaved fingers of the IDT, such that the height of the first cavity is defined between a bottom surface of the lid and a surface of the dielectric layer that is opposite the IDT.

12. A filter device comprising:
at least one piezoelectric layer;
a plurality of interdigital transducers (IDTs) at a surface of the at least one piezoelectric layer and each comprising a plurality of interleaved fingers;
a plurality of lids disposed above the at least one piezoelectric layer, respectively, and defining a plurality of first cavities between the respective plurality of lids and the at least one piezoelectric layer, at least one substrate disposed below the at least one piezoelectric layer, respectively, and opposite the plurality of lids; and at least one dielectric layer disposed between the at least one substrate and the at least one piezoelectric layer and having a plurality of second cavities extending at least partially therein;

wherein a height of each of the plurality of first cavities is greater than a pitch of at least two interleaved fingers of the plurality of interleaved fingers and at most four times greater than a height of each of the plurality of second cavities.

13. The filter device of claim 12, wherein the height of each of the plurality of first cavities is greater than or equal to the height of each of the plurality of second cavities.

14. The filter device of claim 12, wherein the pitch corresponds to a center-to-center spacing between the at least two interleaved fingers.

15. The filter device of claim 12, wherein the plurality of lids each comprise a semiconductor material.

16. The filter device of claim 12, wherein the at least one piezoelectric layer and the plurality of IDTs are each configured such that a respective radio frequency signal applied to the respective IDT primarily excites a shear acoustic mode within the at least one piezoelectric layer.

17. The filter device of claim 12, further comprising a gas filled in each of the plurality of first cavities and each of the plurality of second cavities that is configured to increase thermal conduction through the respective cavities.

18. The filter device of claim 12, wherein the respective heights of the plurality of first cavities and the plurality of second cavities are measured in a direction perpendicular to the surface of the at least one piezoelectric layer.

19. The filter device of claim 12, further comprising:

a plurality of metal layers disposed between the plurality of lids and the at least one piezoelectric layer, respectively, such that an inner surface of the plurality of metal layers defines the plurality of first cavities between the plurality of lids and the at least one piezoelectric layer; and at least one additional dielectric layer on the plurality of IDTs and between the interleaved fingers of each of the IDTs, such that the height of each of the plurality of first cavities is defined between respective bottom surfaces of the plurality of lids and a surface of the at least one dielectric layer that is opposite the plurality of IDTs.

20. A radio frequency module, comprising:

a filter device having a plurality of acoustic resonators that each comprise:
 a piezoelectric layer;
 an interdigital transducer (IDT) at a surface of the piezoelectric layer and comprising a plurality of interleaved fingers;
 a lid disposed above the piezoelectric layer and defining a first cavity between the lid and the piezoelectric layer;
 a substrate disposed below the piezoelectric layer opposite the lid; and
 a dielectric layer disposed between the substrate and the piezoelectric layer and having a second cavity extending at least partially therein, wherein a radio frequency circuit coupled to the filter device, the filter device and the radio frequency circuit being enclosed within a common package, and wherein, for each of the plurality of acoustic resonators, a height of the first cavity is greater than a pitch of at least one pair of interleaved fingers of the plurality of interleaved fingers and at most four times greater than a height of the second cavity.

* * * * *